(12) United States Patent
Do et al.

(10) Patent No.: US 11,635,176 B2
(45) Date of Patent: Apr. 25, 2023

(54) NANO-SCALE LIGHT-EMITTING DIODE (LED) ELECTRODE ASSEMBLY EMITTING POLARIZED LIGHT, METHOD OF MANUFACTURING THE SAME, AND POLARIZED LED LAMP HAVING THE SAME

(71) Applicant: SAMSUNG DISPLAY CO., LTD., Yongin-si (KR)

(72) Inventors: Young Rag Do, Seoul (KR); Yeon Goog Sung, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 17/467,163

(22) Filed: Sep. 3, 2021

(65) Prior Publication Data

US 2021/0396360 A1 Dec. 23, 2021

Related U.S. Application Data

(63) Continuation of application No. 16/866,383, filed on May 4, 2020, now Pat. No. 11,112,070, which is a
(Continued)

(30) Foreign Application Priority Data

Nov. 17, 2015 (KR) .......................... 10-2015-0161292

(51) Int. Cl.
*F21K 9/64* (2016.01)
*H01L 33/18* (2010.01)
(Continued)

(52) U.S. Cl.
CPC ............ *F21K 9/64* (2016.08); *H01L 25/0753* (2013.01); *H01L 25/50* (2013.01); *H01L 33/18* (2013.01);
(Continued)

(58) Field of Classification Search
CPC ....... F21K 9/64; H01L 25/0753; H01L 25/50; H01L 33/18; H01L 33/387; H01L 33/44;
(Continued)

(56) References Cited

U.S. PATENT DOCUMENTS 6,320,209 B1 11/2001 Hata et al.
10,641,439 B2 5/2020 Do et al.
(Continued)

FOREIGN PATENT DOCUMENTS

JP 2014-057050 A 3/2014
KR 1020120012381 A 2/2012
(Continued)

*Primary Examiner* — Tu-Tu V Ho
(74) *Attorney, Agent, or Firm* — Lewis Roca Rothgerber Christie LLP

(57) ABSTRACT

The present invention relates to a nano-scale light emitting diode (LED) electrode assembly emitting polarized light, a method of manufacturing the same, and a polarized LED lamp having the same, and more particularly, to a nano-scale LED electrode assembly in which partially polarized light close to light that is linearly polarized having one direction is emitted as an emitted light when applying a driving voltage to the nano-scale LED electrode assembly and also nano-scale LED devices are connected to a nano-scale electrode without defects such as an electrical short circuit while maximizing a light extraction efficiency, a method of manufacturing the same, and a polarized LED lamp having the same.

20 Claims, 18 Drawing Sheets

Related U.S. Application Data continuation of application No. 16/206,982, filed on Nov. 30, 2018, now Pat. No. 10,641,439, which is a continuation of application No. 15/355,024, filed on Nov. 17, 2016, now Pat. No. 10,145,518.

(51) Int. Cl.
  *H01L 25/075* (2006.01)
  *H01L 25/00* (2006.01)
  *H01L 33/38* (2010.01)
  *H01L 33/44* (2010.01)
  *H01L 33/62* (2010.01)

(52) U.S. Cl.
  CPC ............ *H01L 33/387* (2013.01); *H01L 33/44* (2013.01); *H01L 33/62* (2013.01); *H01L 2933/0016* (2013.01); *H01L 2933/0033* (2013.01); *H01L 2933/0066* (2013.01)

(58) Field of Classification Search
  CPC ............ H01L 33/62; H01L 2933/0016; H01L 2933/0033; H01L 2933/0066
  USPC .............................................. 257/91; 362/84
  See application file for complete search history.

(56) References Cited

U.S. PATENT DOCUMENTS

| | | | |
|---|---|---|---|
| 10,910,512 B2* | 2/2021 | Sung | ........................ H01L 33/06 |
| 2010/0127238 A1 | 5/2010 | Kim et al. | |
| 2013/0221385 A1 | 8/2013 | Shibata et al. | |
| 2016/0211245 A1 | 7/2016 | Do | |
| 2018/0158997 A1 | 6/2018 | Neyts et al. | |

FOREIGN PATENT DOCUMENTS

| | | |
|---|---|---|
| KR | 101429095 B1 | 8/2014 |
| KR | 101436123 B1 | 11/2014 |
| KR | 1020150006798 A | 1/2015 |
| KR | 1020160006339 A | 1/2016 |

* cited by examiner

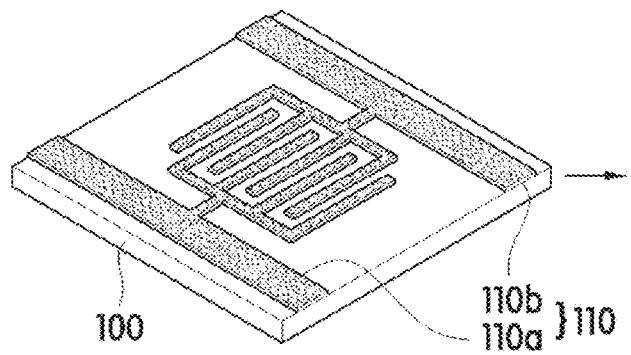 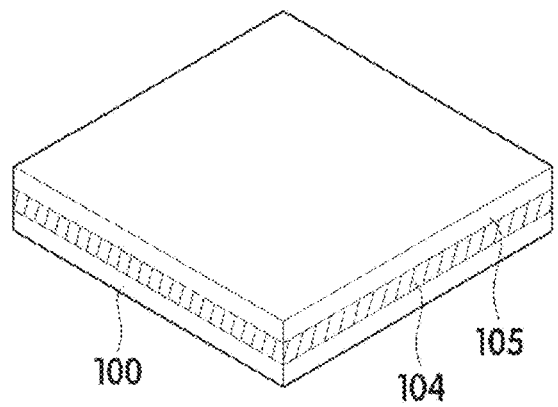
FIG. 11A    FIG. 11B
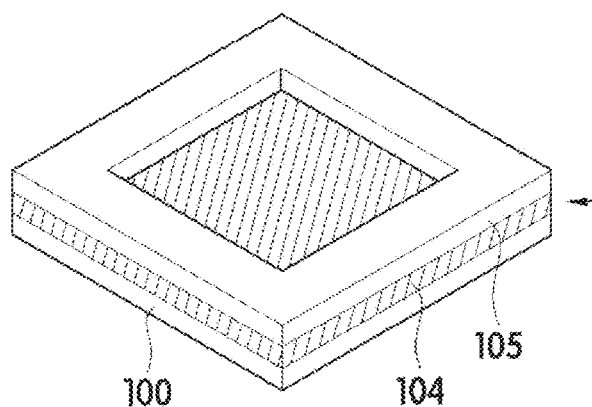 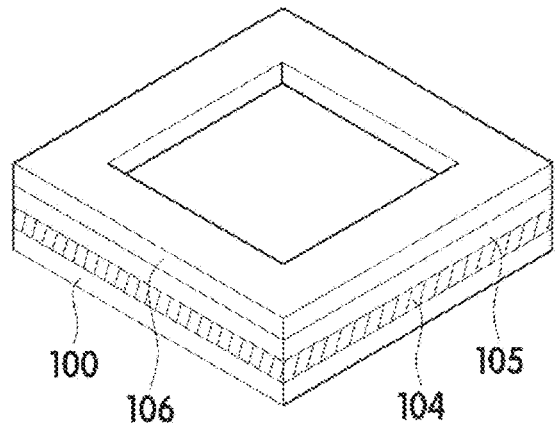
FIG. 11D    FIG. 11C
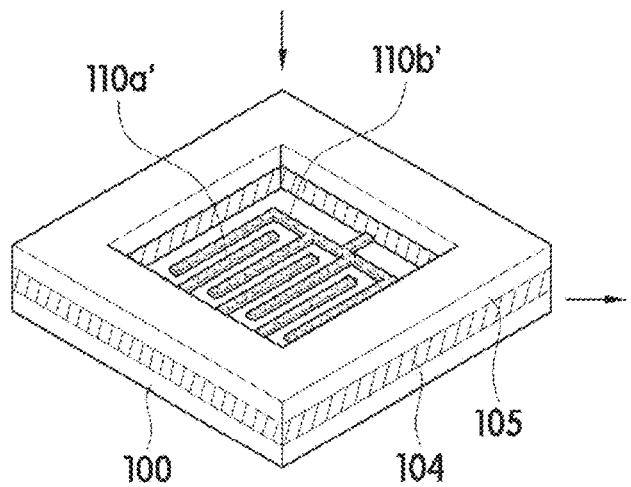 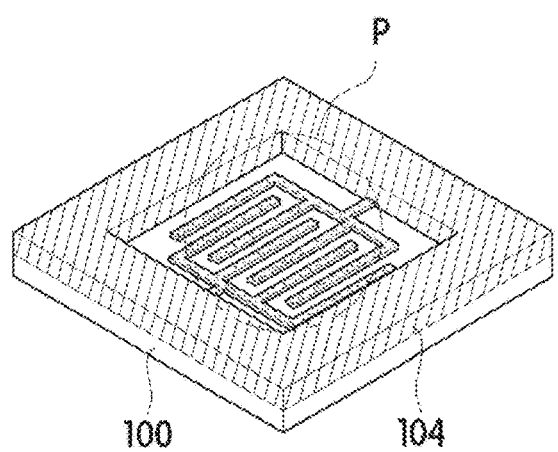
FIG. 11E    FIG. 11F

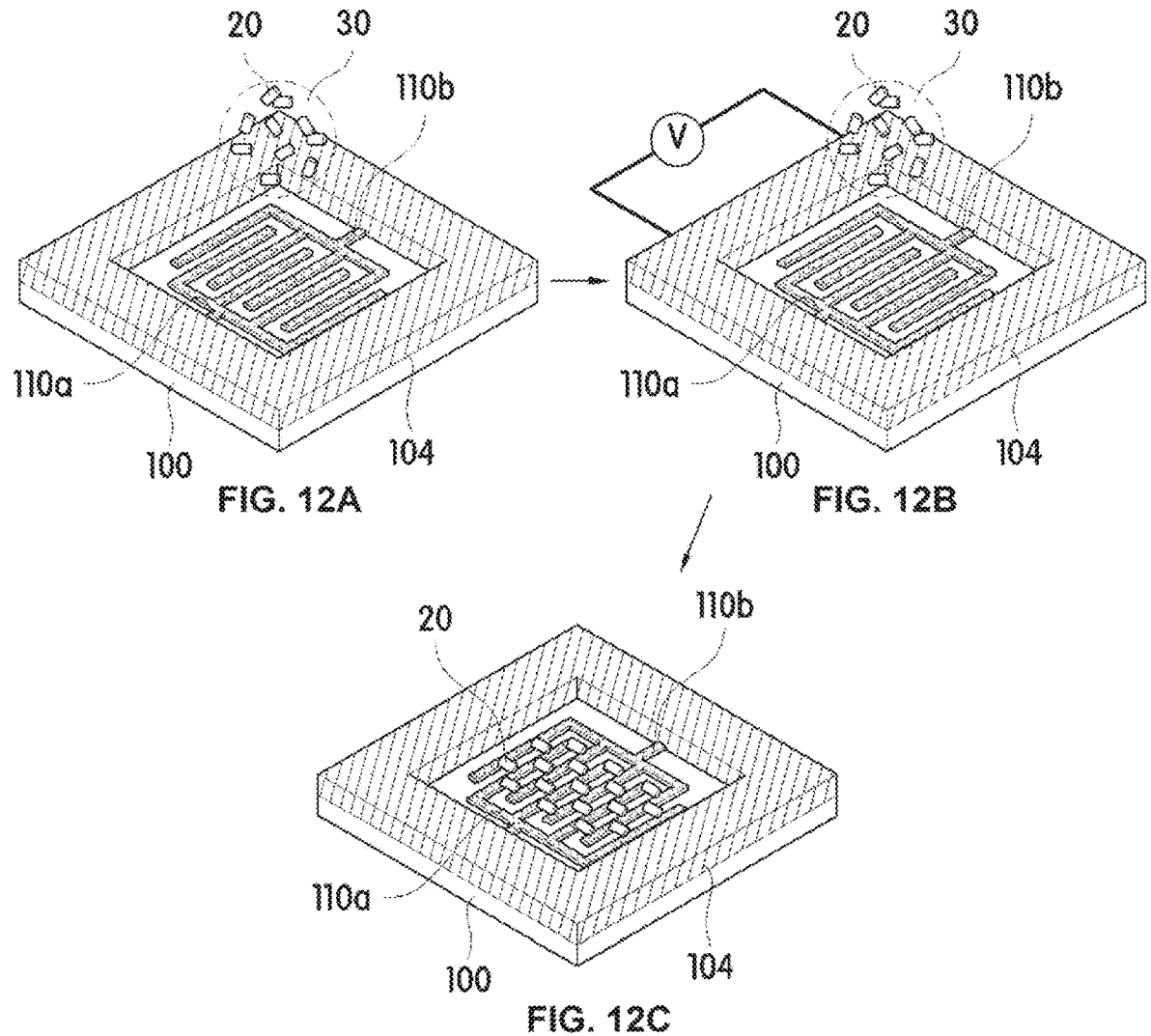

NANO-SCALE LIGHT-EMITTING DIODE (LED) ELECTRODE ASSEMBLY EMITTING POLARIZED LIGHT, METHOD OF MANUFACTURING THE SAME, AND POLARIZED LED LAMP HAVING THE SAME

CROSS-REFERENCE TO RELATED APPLICATIONS

This application is a continuation of U.S. patent application Ser. No. 16/866,383, filed May 4, 2020, which is a continuation of U.S. patent application Ser. No. 16/206,982, filed Nov. 30, 2018, now U.S. Pat. No. 10,641,439, which is a continuation of U.S. patent application Ser. No. 15/355,024, filed Nov. 17, 2016, now U.S. Pat. No. 10,145,518, which claims priority to and the benefit of Korean Patent Application No. 10-2015-0161292, filed Nov. 17, 2015, the entire content of all of which is incorporated herein by reference.

BACKGROUND

1. Field of the Invention

The present invention relates to a nano-scale light emitting diode (LED) electrode assembly emitting polarized light, a method of manufacturing the same, and a polarized LED lamp having the same, and more particularly, to a nano-scale LED electrode assembly that emits polarized light, in which partially polarized light close to light that is linearly polarized in one direction is emitted when a driving voltage is applied to the nano-scale LED electrode assembly, while light extraction efficiency is simultaneously maximized and a nano-scale LED device is connected to a nano-scale electrode assembly without defects such as an electrical short circuit, etc. a method of manufacturing the same, and a polarized LED lamp having the same.

2. Discussion of Related Art

Light emitting diodes (LEDs) have been actively developed, for example, by Nakamura of the Japanese Nichia Co., who succeeded in fusing a high-quality single crystal gallium-nitride (GaN) semiconductor by applying a low-temperature GaN compound buffer layer in 1992. An LED is a semiconductor having a structure in which an n-type semiconductor crystal in which majority carriers are electrons and a p-type semiconductor crystal in which majority carriers are holes which come in contact with each other using a characteristic of a compound semiconductor, and is a semiconductor device in which an electrical signal is converted into light having a wavelength band of a desired region. Regarding LEDs, Korean Patent Publication No. 2009-0121743 discloses a method of manufacturing an LED, and an LED manufactured according thereto.

LED semiconductors have low energy consumption because of their great light conversion efficiency, have a semi-permanent lives, and are eco-friendly green devices, and thus have been called revolutionary in the field of light. Recently, due to developments in compound semiconductor technology, high-intensity red, orange, green, blue, and white LEDs have been developed, and such LEDs are being applied in various fields such as traffic lights, mobile phones, automobile headlights, outdoor billboards, liquid crystal display (LCD), back light units (BLUs), interior and exterior lighting, etc., and active studies are continuously progressing both in Korea and elsewhere. In particular, the gallium nitride (GaN) compound semiconductor having a wide bandgap is a material used for manufacturing LED semiconductors emitting light in the green, blue, and ultraviolet regions, and many studies thereon are progressing because blue LED devices can be used to manufacture white LED devices.

Among this series of studies, studies using nano-scale LED devices in which the sizes of the LEDs are manufactured in nano-scale or micro-scale units are actively progressing, and studies on applying nano-scale LED devices to lightings, displays, etc. are also progressing. Aspects that have continuously received attention in such studies relate to an electrode which is able to apply power to a nano-scale LED device, an application purpose, an electrode arrangement for decreasing a space occupied by an electrode, and a method of installing a nano-scale LED in an arranged electrode, etc.

Among these, the method of installing a nano-scale LED in an arranged electrode still has a problem that it is difficult to arrange and install a nano-scale device on an electrode as desired due to size limitations of nano-scale LED devices. This is because nano-scale LED devices cannot be arranged and installed in a desired electrode region by hand one by one due to the nano-scale or micro-scale sizes of nano-scale LED devices.

Further, even when a nano-scale LED device is installed in a desired electrode region, it is very difficult to control the number of nano-scale LED devices and the positional relationship between the nano-scale LED devices and the electrode included in a unit electrode region as desired, and when LED devices are arranged on a two-dimensional plane, it is difficult to obtain an excellent amount of light because the number of LED devices included in the unit electrode region is limited. Further, it is difficult to obtain a desired amount of light because not every LED device connected to two different electrodes is able to emit light without defects such as an electrical short circuit, etc.

In order to solve this problem, the inventor(s) of the present invention disclosed a manufacturing method of implementing a nano-scale LED device as an electrode assembly by applying power to a nano-scale electrode line, and a nano-scale LED electrode assembly using the same in Korean Patent Registration No. 10-1490758, but the nano-scale LED device is not aligned as desired because the electrode assembly is implemented with self-alignment of the nano-scale LED device, and the nano-scale LED electrode assembly having irregular device directivity and connected to different electrodes is implemented, and thus it is difficult to install the nano-scale LED at a desired level and it is difficult to obtain the desired amount of light.

In order to solve this problem, the inventor(s) of the present invention recognized that a nano-scale LED electrode assembly emits partially polarized light close to light that is linearly polarized in one direction and also that an intensity of the emitted light is remarkably increased when the device is installed on an electrode with constant directivity through continued studies for improving alignment when LED devices are installed on an electrode, thus completing present invention.

SUMMARY OF THE INVENTION

The present invention is directed to providing a nano-scale light emitting diode (LED) electrode assembly that enables intensity of emitted light to be improved by increasing alignment of nano-scale LED devices installed in a nano-scale electrode line and remarkably increasing the number of nano-scale LED devices installed, and that emits partially polarized light close to light that is linearly polarized as the emitted light, and a method of manufacturing the same.

Further, the present invention is directed to providing a polarized LED lamp emitting remarkably excellent polarized light without a polarizer that transmits only polarized light of a specific direction, through a nano-scale LED electrode assembly emitting partially polarized light close to light that is linearly polarized in one direction.

According to a first implementation example of the present invention in order to achieve the first purpose described above, there is provided a nano-scale LED electrode assembly emitting polarized light including an electrode line including a first installation electrode and a second installation electrode which are spaced apart from each other on the same plane, and a plurality of nano-scale light emitting diode (LED) devices in which one end of the device in a longitudinal direction is in contact with the first installation electrode and the other end is in contact with the second installation electrode, wherein the number of nano-scale LED devices having an installation angle which is within an angle change range of ±30° from an average installation angle of all of the nano-scale LED devices emitting light in the nano-scale LED electrode assembly is equal to or more than 80% of the total number of nano-scale LED devices emitting light, where the installation angle is an acute angle among angles formed by the nano-scale LED device and the first installation electrode or the second installation electrode measured when the installation angle when the nano-scale LED device is installed to be perpendicular to the first installation electrode or the second installation electrode is defined as 0°.

According to one implementation example of the present invention, a length of the nano-scale LED device may be 100 nm to 10 μm.

According to another implementation example of the present invention, the nano-scale LED device may include a first conductive semiconductor layer, an active layer formed on the first conductive semiconductor layer, and a second conductive semiconductor layer formed on the active layer, and include an insulating film covering an entire outer surface of at least the active layer in order to prevent an electrical short circuit generated by contact between the active layer of the nano-scale LED device and the electrode line.

According to still another implementation example of the present invention, an aspect ratio of the nano-scale LED device may be 1.2 to 100.

According to another implementation example of the present invention, the number of nano-scale LED devices having an installation angle which is within the angle change range of ±30° based on the average installation angle may be equal to or more than 90% of the total number of nano-scale LED devices emitting light.

According to still another implementation example of the present invention, the number of nano-scale LED devices having an installation angle which is within the angle change range of ±10° of the average installation angle of all of the nano-scale LED devices emitting light in the nano-scale LED electrode assembly may be equal to or more than 70% of the total number of nano-scale LED devices emitting light.

According to the present invention in order to achieve the first purpose described above, there is provided a method of manufacturing a nano-scale light emitting diode (LED) electrode assembly emitting polarized light, including: (1) injecting a solution including a plurality of nano-scale LED devices into an electrode line including a base substrate, a first installation electrode formed on the base substrate, and a second installation electrode formed to be spaced apart from each other on the same plane as the first installation electrode; and (2) causing the plurality of nano-scale LED devices to self-align by applying power to the electrode line in order to connect ends of the nano-scale LED devices to the first installation electrode and the second installation electrode, wherein the power is alternating current power which has a voltage of 10 to 500 $V_{pp}$, and a frequency of 50 kHz to 1 GHz.

According to one implementation example of the present invention, the nano-scale LED device may include a first conductive semiconductor layer, an active layer formed on the first conductive semiconductor layer, and a second conductive semiconductor layer formed on the active layer, and include an insulating film covering an entire outer surface of at least the active layer in order to prevent an electrical short circuit by contact between the active layer of the nano-scale LED device and the electrode line.

According to another implementation example of the present invention, an aspect ratio of the nano-scale LED device may be 1.2 to 100.

According to another implementation example of the present invention, step (1) may include: 1-1) manufacturing the electrode line including the base substrate, the first installation electrode formed on the base substrate, and the second installation electrode formed to be spaced apart from each other on the same plane as the first installation electrode; 1-2) forming an insulating barrier surrounding an electrode line region in which the nano-scale LED devices are installed on the base substrate; and 1-3) injecting the solution including the plurality of nano-scale LED devices into the electrode line region surrounded by the insulating barrier.

According to another implementation example of the present invention, the power may be alternating current power which has a voltage of 35 to 250 $V_{pp}$, and a frequency of 90 kHz to 100 MHz.

According to a second implementation example of the present invention in order to achieve the first purpose described above, there is provided a nano-scale LED electrode assembly emitting polarized light including an electrode line including a first installation electrode and a second installation electrode which are spaced apart from each other on the same plane, and a plurality of nano-scale LED devices of which one end of the device in a longitudinal direction is in contact with the first installation electrode and the other end is in contact with the second installation electrode, wherein the nano-scale LED electrode assembly emits polarized light in which a polarization ratio according to the following Equation 1 is equal to or more than 0.25.

$$\rho = \frac{I_{max} - I_{min}}{I_{max} + I_{min}} \qquad \text{[Equation 1]}$$

In Equation 1, $I_{max}$, and $I_{min}$ are a maximum intensity and a minimum intensity of the light measured while rotating a polarization axis of a polarizer from −90° to +90° after placing the polarizer on a light emitting surface of the nano-scale LED electrode assembly.

According to one implementation example of the present invention, the polarization ratio according to the Equation 1 may be equal to or more than 0.40.

According to a third implementation example of the present invention in order to achieve the first purpose described above, there is provided a nano-scale LED electrode assembly emitting polarized light including an electrode line including a first installation electrode and a second installation electrode which are spaced apart from each other on the same plane, and a plurality of nano-scale LED devices of which one end of the device in a longitudinal direction is in contact with the first installation electrode and the other end is in contact with the second installation electrode, wherein an average installation angle of all of the nano-scale LED devices emitting in the nano-scale LED electrode assembly is equal to or less than 30°, where the installation angle is an acute angle among angles formed by the nano-scale LED device and the first installation electrode or the second installation electrode measured when the installation angle of a case in which the nano-scale LED device is installed to be perpendicular to the first installation electrode or the second installation electrode is defined as 0°.

According to one implementation example of the present invention, the average installation angle may be equal to or less than 20°.

According to the present invention in order to achieve the second purpose described above, there is provided a polarized light emitting diode (LED) lamp, including: a supporter; and a nano-scale LED electrode assembly according to any one of the first implementation example to the third implementation example of the present invention included inside the supporter.

According to one implementation example of the present invention, the nano-scale LED electrode assembly may include one among a nano-scale UV LED device, a nano-scale blue LED device, a nano-scale green LED device, a nano-scale yellow LED device, a nano-scale amber LED device, and a nano-scale red LED device.

According to another implementation example of the present invention, the supporter may have a cup shape, and further include a fluorescent substance included in a cup and excited by light emitted from a nano-scale LED electrode assembly.

According to still another implementation example of the present invention, the lamp may include a plurality of nano-scale LED electrode assemblies, and each of the plurality of nano-scale LED electrode assemblies may independently include one among the nano-scale UV LED device, the nano-scale blue LED device, the nano-scale green LED device, the nano-scale yellow LED device, the nano-scale amber LED device, and the nano-scale red LED device. In this case, the polarized LED lamp maybe a lamp emitting white light.

According to another implementation example of the present invention, the plurality of nano-scale LED electrode assemblies may be arranged to have a line arrangement or a plane arrangement.

According to still another implementation example of the present invention, when the nano-scale LED electrode assembly includes the nano-scale UV LED device, the fluorescent substance may be any one or more among blue, yellow, green, amber, and red, and when the nano-scale LED electrode assembly includes the nano-scale blue LED device, the fluorescent substance may be any one or more among yellow, green, amber, and red.

Here, a term used herein will be described.

"Installation electrode" as used herein may mean an electrode which is in direct contact with both ends of the nano-scale LED device and is not a driving electrode for driving the nano-scale LED electrode assembly.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 11A through 11F are diagrams illustrating a manufacturing process of forming an insulating barrier according to an embodiment of the present invention;

FIGS. 12A through 12C are diagrams illustrating a process of manufacturing a nano-scale electrode assembly according to one implementation example of the present invention;

DETAILED DESCRIPTION OF EXEMPLARY EMBODIMENTS

Figure 1:
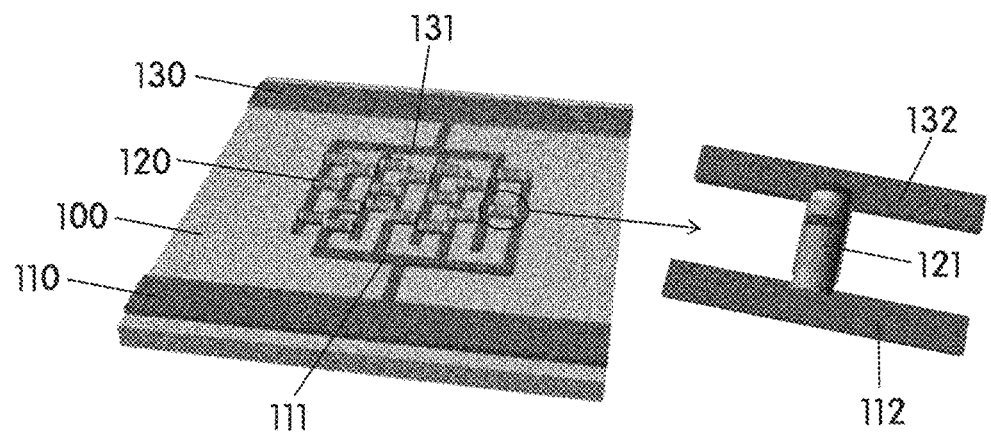
FIG. 1 is a perspective view and a partially enlarged view of a nano-scale light emitting diode (LED) electrode assembly according to one implementation example of the present invention.

Hereinafter, embodiments of the present invention will be described in more detail with reference to the accompanying drawings.

As described above, technology of installing a nano-scale subminiature light emitting diode (LED) device in a subminiature electrode line to be electrically connected at a desired level was insufficient in a conventional method. In order to solve this problem, the inventor(s) of the present invention implemented a nano-scale LED electrode assembly by applying power to a nano-scale electrode line, but since the electrode assembly was implemented by self-alignment of the nano-scale LED devices, the nano-scale LED device was not aligned as desired, the nano-scale LED electrode assembly which was connected to different electrodes with irregular device directivity was implemented, and thus it was difficult to install the nano-scale LED devices in the desired number and alignment and to obtain the desired amount of light.

In the present invention, a nano-scale LED electrode assembly emitting polarized light may include an electrode line including a first installation electrode and a second installation electrode which are spaced apart from each other on the same plane, and a plurality of nano-scale LED devices in which one end of the device is in contact with the first installation electrode and the other end of the devices is in contact with the second installation electrode, and the number of nano-scale LED devices having an installation angle which is within an angle change range of ±30° of an average installation angle of all of the nano-scale LED devices emitting light in the nano-scale LED assembly is equal to or more than 80% of the total number of nano-scale LED electrodes emitting light in the nano-scale LED electrode assembly. Accordingly, alignment of the nano-scale LED devices installed in the nano-scale electrode line may be remarkably improved, the number of nano-scale LED devices installed is remarkably increased, an intensity of emitted light and electrical connectivity may be increased due to the increase in the number of nano-scale LED devices installed, and the installed nano-scale LED devices are connected to the nano-scale electrode without defects such as an electrical short circuit, etc., and thus partially polarized light close to linearly polarized light is emitted as the emitted light.

First, a nano-scale LED electrode assembly including the electrode line including the first installation electrode and the second installation electrode which are spaced apart from each other on the same plane, and the plurality of nano-scale LED devices in which one end of the device is in contact with the first installation electrode and the other end of the devices is in contact with the second installation electrode will be described.

Since the nano-scale LED electrode assembly is referenced by Korean Patent Registration No. 10-1429095, and Korean Patent Application No. 2014-0085384 disclosed by the inventor(s) of the present invention, a detailed description regarding a structure, a shape, and a material of an electrode, and a method of manufacturing an electrode line, etc. will be omitted, and a configuration of the nano-scale LED electrode assembly related to the present invention will be described in detail.

FIG. 1 is a perspective view and a partially enlarged view of a nano-scale light emitting diode (LED) electrode assembly according to one implementation example of the present invention, and the nano-scale LED electrode assembly may include an electrode line including a first installation electrode 110 and 111 formed on a base substrate 400 and a second installation electrode 130 and 131 formed to be spaced apart from the first installation electrode 110 and 111 on the same plane, and a plurality of nano-scale LED devices 120 which are simultaneously connected to the first and second installation electrodes. In detail, one end of one device 121 in a longitudinal direction among the plurality of nano-scale LED devices may be in contact with the first installation electrode 112, and the other end may be electrically connected by being in contact with the second installation electrode 132.

In the nano-scale LED electrode assembly shown in FIG. 1, the nano-scale LED devices may be connected to the electrodes by lying prostrate between the first installation electrode 111 and the second installation electrode 131 placed on the same plane, and because the nano-scale LED devices need not necessarily be connected to be perpendicular to the electrode, the nano-scale LED devices and the electrode do not need to be connected three-dimensionally to be perpendicular, and electrical connectivity may be improved. Further, the nano-scale LED devices may be formed horizontally because the electrodes are formed to be spaced apart from each other on the same plane, and thus light extraction efficiency of the nano-scale LED device may be remarkably improved.

Meanwhile, it is next to impossible for a person or a machine to manufacture the nano-scale LED electrode assembly shown in FIG. 1 by installing the nano-scale LED devices separated into units one by one because the sizes of the nano-scale LED devices such as the widths of the electrodes and the distance between the electrodes are on a micro-scale or nano-scale. The inventor(s) of the present invention manufactured the nano-scale LED electrode assembly shown in FIG. 1 using a method in which the nano-scale LED devices were self-aligned and connected to two different installation electrodes by applying power after dropping a solution including the nano-scale LED devices on a nano-scale electrode line, but was quite difficult to align the nano-scale LED devices at a desired level.

Figure 2:
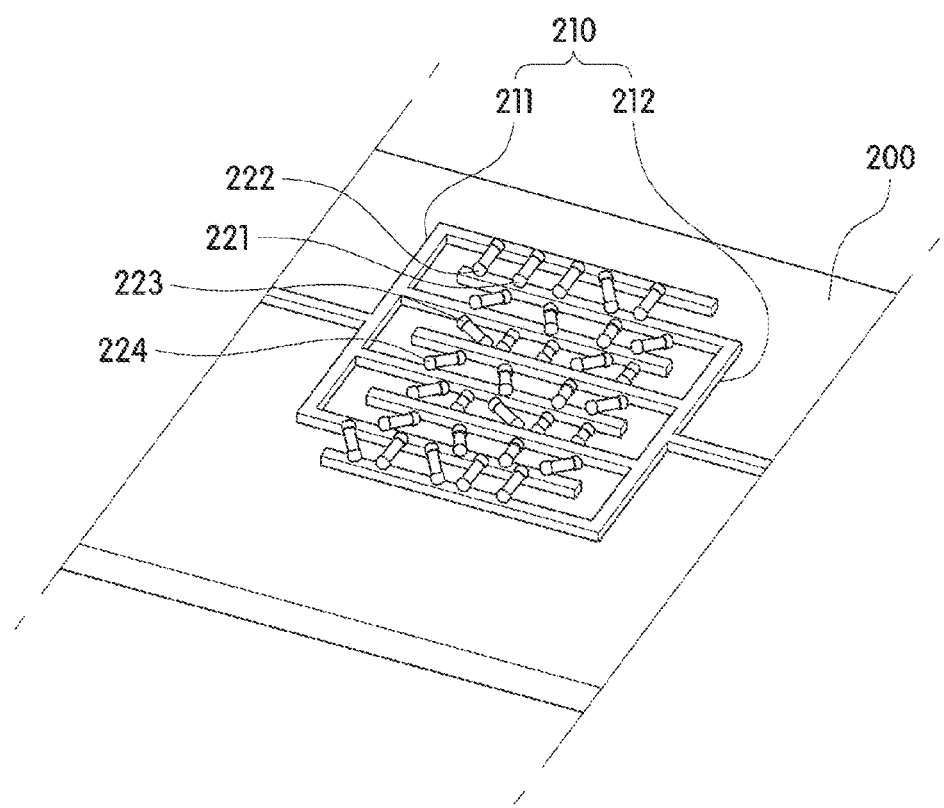
FIG. 2 is a perspective view of a nano-scale LED electrode assembly according to a comparison example of the present invention.

In detail, FIG. 2 is a perspective view of a nano-scale LED electrode assembly according to a comparison example of the present invention, and illustrates a nano-scale LED electrode assembly in which a plurality of nano-scale LED devices 221, 222, 223, and 224 are connected to an electrode line including a first installation electrode 211 and a second installation electrode 212 formed to be spaced apart from each other on the same plane.

In the nano-scale LED electrode assembly shown in FIG. 2, examining alignment of the nano-scale LED devices, some of the nano-scale LED devices 221, 222, and 224 may be connected on upper surfaces of the two different installation electrodes, and some of the nano-scale LED device 223 may be connected between sides of the two different installation electrodes, and in this case, examining the alignment of the plurality of nano-scale LED devices 221, 222, 223, and 224, some of the nano-scale LED devices 221 and 222 may be uniformly aligned so that longitudinal directions of the installation electrode and the device are perpendicular to each other, but alignment of the plurality of nano-scale LED devices installed on the electrode line may be irregular since the nano-scale LED devices 223 are obliquely connected between the sides of the installation electrodes and the nano-scale LED devices 224 are obliquely connected on an upper surface of the installation electrode in another direction.

As described above, since the nano-scale devices are substantially nano-scale, the nano-scale LED devices cannot be installed precisely in a desired position and in a desired direction on the electrode line one by one by a machine or the hand of a person, and it is difficult to uniformly install all of the nano-scale LED devices to have directivity even using the conventional method disclosed by the inventor(s) of the present invention. In detail, in the method disclosed by the inventor(s) of the present invention, the nano-scale LED devices may be self-aligned on the electrode according to a device surface polarizing phenomenon and an electrostatic force between the electrode and the polarized device under an effect of an electric field, and in this case, it is quite difficult to uniformly install all of the nano-scale LED devices to have directivity since a device movement disposition is influenced by where the nano-scale LED devices are located on the two different electrodes before the electric field is formed, and how the nano-scale LED devices are aligned.

Figure 3:
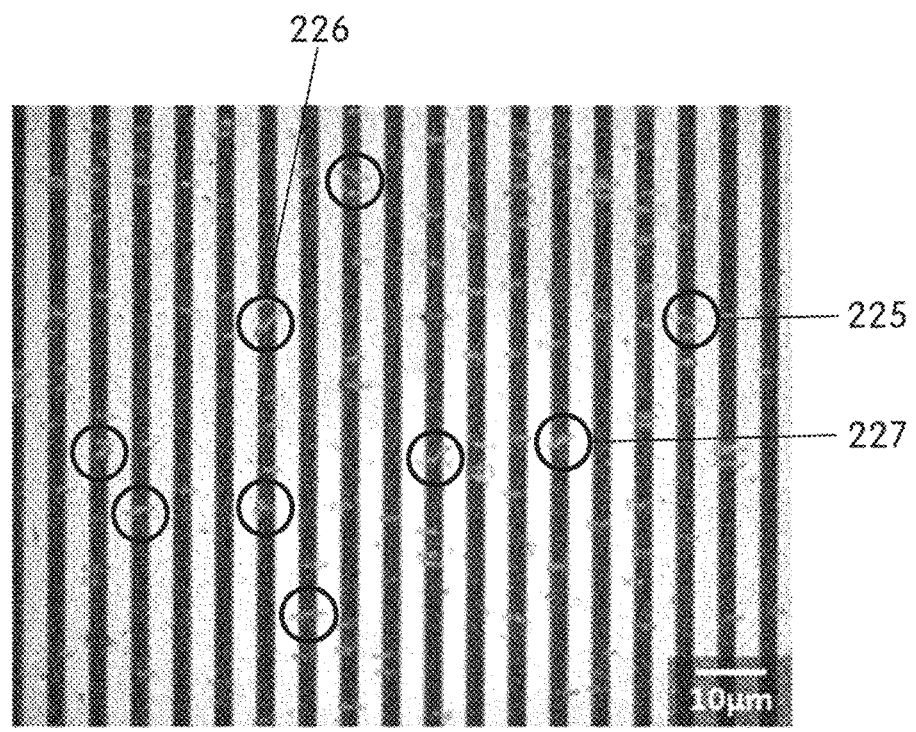
FIG. 3 is an optical microscope photograph of a nano-scale LED device according to a comparison example of the present invention.

In detail, FIG. 3 illustrates an optical microscope photograph of nano-scale LED devices according to a comparison example of the present invention, and because some of the nano-scale LED devices 225, 226, and 227 are obliquely connected to the two different installation electrodes, although the nano-scale LED devices are able to be installed on the nano-scale electrode lines, aligning all of the nano-scale LED devices to have any disposition or aligning all of the nano-scale LED devices to be vertically installed on the electrode is another problem.

Accordingly, the inventor(s) of the present invention recognized that, when the nano-scale devices are self-aligned based on a specific condition according to the present invention, the nano-scale LED devices have remarkably excellent directivity and alignment, are simultaneously connected to the two installation electrodes without an electrical short circuit, emit light having further improved intensity, and also emit partially polarized light close to light which is linearly polarized in any one direction through continued studies on improving the alignment of the devices, thus completing the present invention.

First, according to a first implementation example of the present invention, the number of nano-scale LED devices having an installation angle which is within an angle change range of ±30° of an average installation angle of all of the nano-scale LED devices emitting light in the nano-scale LED electrode assembly may be 80% or more, preferably 90% or more, of the total number of nano-scale LED devices emitting light.

Further, according to an embodiment of the present invention, the number of nano-scale LED devices having an installation angle which is within an angle change range of ±10° of an average installation angle of all of the nano-scale LED devices emitting light in the nano-scale LED electrode assembly may be 70% or more, preferably 80% or more, of the total number of nano-scale LED devices, and thus the nano-scale LED devices may emit light that is linearly polarized closer to a specific direction, and the intensity of the light emitted by the number of nano-scale LED devices installed may be further increased.

First, the installation angle may be a parameter determining how obliquely the installed nano-scale LED devices are installed with respect to the first installation electrode or the second installation electrode when the nano-scale LED devices are installed to be perpendicular to the first installation electrode and the second installation, and may be an acute angle among angles between a longitudinal axis of the nano-scale LED devices and the first installation electrode or the second installation electrode measured when the installation angle of a case in which the nano-scale LED device is installed to be perpendicular to the installation electrode is defined as 0°. In this case, the nano-scale LED devices which are a measurement target of installation angle may be the nano-scale LED devices actually emitting light when a driving voltage is applied to the nano-scale LED devices, and are not the nano-scale LED devices which are simply included in the nano-scale LED electrode assembly regardless of whether the nano-scale LED devices emit light.

Figure 4:
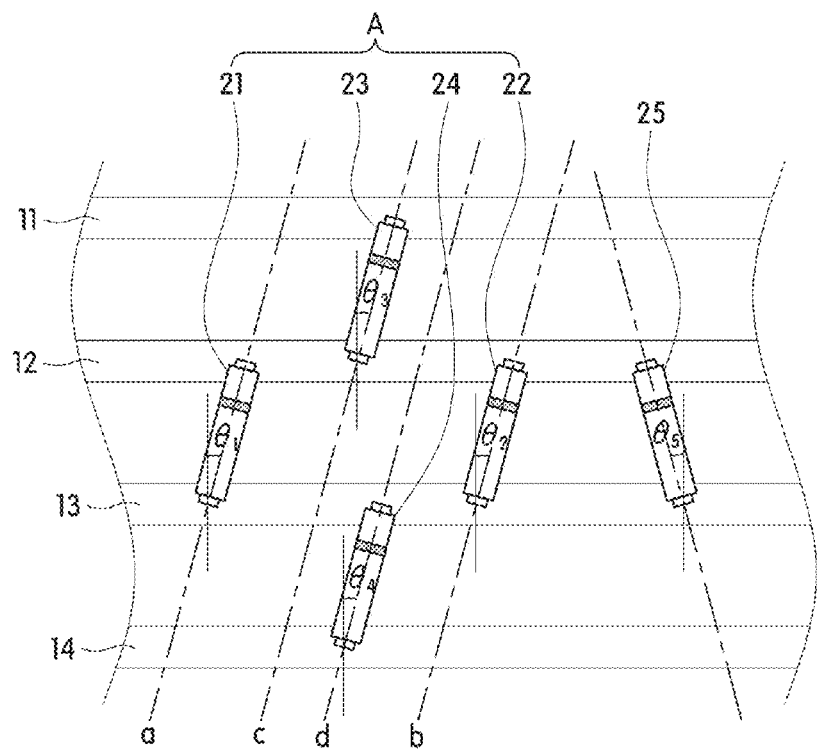
FIG. 4 is a planar diagram of a nano-scale electrode assembly according to an embodiment of the present invention.

Referring to FIG. 4, when the driving power is applied to all of the plurality of nano-scale LED devices 21, 22, 23, 24, and 25 in which both ends of the devices are connected on the first installation electrodes 11 and 13 and the second installation electrodes 12 and 14 and all of the plurality of nano-scale LED devices 21, 22, 23, 24, and 25 emit light, in this case, the installation angle of a first nano-scale LED device 21 may be an acute angle $\theta_1$ among angles between a longitudinal direction a of the first nano-scale LED device and the first installation electrode 13. Further, the average installation angle may be an average value of the installation angles of all of the light-emitting nano-scale LED devices 21, 22, 23, 24, and 25. In this case, the angle included in the angle change range of ±30° of the average installation angle may be the average installation angle −30° to the average installation angle +30°.

In this case, according to the first implementation example of the present invention, the fact that the number of nano-scale LED devices having the installation angle which is within the angle change range is equal to or more than 80% of the total number of nano-scale LED devices may mean that a tendency for a longitudinal direction of the nano-scale LED devices installed in the installation electrode to be aligned in anyone direction is great.

Referring to FIG. 4, assuming that the installation angles $\theta_1$, $\theta_2$, $\theta_3$, $\theta_4$, and $\theta_5$ of the plurality of nano-scale LED devices 21, 22, 23, 24, and 25, are 15°, 30°, 32°, 27°, and 65°, respectively, the average installation angle is 33.8°, the angle change range of ±30° of the average installation angle is 3.8° to 63.8°, and accordingly, the number of nano-scale LED devices having the installation angle which is within the angle change range among the five nano-scale LED devices 21, 22, 23, 24, and 25 is 4, and thus it can be said that 80% of all of the light-emitting nano-scale LED devices have the installation angle included in the angle change range.

When the nano-scale LED assembly is driven, the alignment of the longitudinal direction of the nano-scale LED devices may need to be improved in order to emit light close to partially polarized light which is linearly polarized in any one direction, and in detail, the nano-scale LED devices which are directly connected to the two installation electrodes formed to be spaced apart from each other on the same plane may be horizontally connected so that sides of the devices (an outer surface which is parallel to the longitudinal axes of the devices) is parallel to the same plane, light emitted from any one nano-scale LED device which is horizontally connected when the driving voltage is applied to the electrode line may have a linearly polarized light characteristic of any specific direction due to a difference between first light directly escaping from the device by being emitted from a multiple quantization well (MQW) of the device and second light escaping from both ends of the device. However, the direction of the polarized light may be dependent on a direction in which the nano-scale LED devices are aligned, and the nano-scale LED devices in which the longitudinal directions are substantially matched among the nano-scale LED devices installed on the electrodes may all emit the linearly polarized light in the same one direction. Accordingly, the nano-scale LED electrode assembly may emit the partially polarized light close to the light that is linearly polarized in any specific direction because the nano-scale LED devices are aligned and installed on the installation electrode so that the longitudinal directions of the nano-scale LED devices are matched substantially, and may emit the light that is linearly polarized in any one direction when the longitudinal directions of all of the nano-scale LED device are aligned and installed to substantially match.

Accordingly, preferably, as the number of nano-scale LED devices having the installation angle which is within the angle change range of ±30° of the average installation angle is increased, the nano-scale LED electrode assembly may emit the polarized light close to the light that is linearly polarized in any one direction, and in another preferable aspect, a width of the angle change based on the average installation angle may be a range smaller than ±30°, preferably ±20° or less, and more preferably ±10 or less, and as the number of nano-scale LED devices having the installation angle which is within the angle change width is increased, the nano-scale electrode assembly may emit the polarized light close to the light that is linearly polarized in any one direction.

When the nano-scale LED devices included in an embodiment of the present invention are the nano-scale LED devices which are generally and widely applied to lamps, displays, etc., the devices may be used without limitation, and preferably, lengths of the nano-scale LED devices may be 100 nm to 10 μm, more preferably 500 nm to 5 μm. When the lengths of the nano-scale LED devices are less than 100 nm, it may be difficult to manufacture a high-efficiency LED device, and when the lengths of the nano-scale LED devices are more than 10 μm, light emitting efficiency of the LED device may be decreased. Shapes of the nano-scale LED devices may be various shapes such as cylindrical shapes or rectangular shapes, and are preferably cylindrical shapes but are not limited thereto. Further, an aspect ratio of the nano-scale LED devices may be 1.2 to 100, preferably 1.2 to 50, more preferably 1.5 to 20, and most preferably 1.5 to 10. When the aspect ratio of the nano-scale LED devices is less than 1.2, the nano-scale LED devices may not be self-aligned even when the power is applied to the electrode line, and when the aspect ratio of the nano-scale LED devices is more than 100, although a voltage of the power needed for self-alignment may be decreased, when the nano-scale LED devices are manufactured using dry etching, etc., it may be difficult to manufacture the devices in which the aspect ratio is more than 100 due to limitations of the process.

Hereinafter, in a description of the nano-scale LED device, "up, "down", "top", "bottom", "upper", and "lower" may refer to the vertical directions up and down based on each layer included in the nano-scale LED devices The nano-scale LED devices may include a first conductive semiconductor layer, an active layer formed on the first conductive semiconductor layer, and a second conductive semiconductor layer formed on the active layer.

Figure 5:
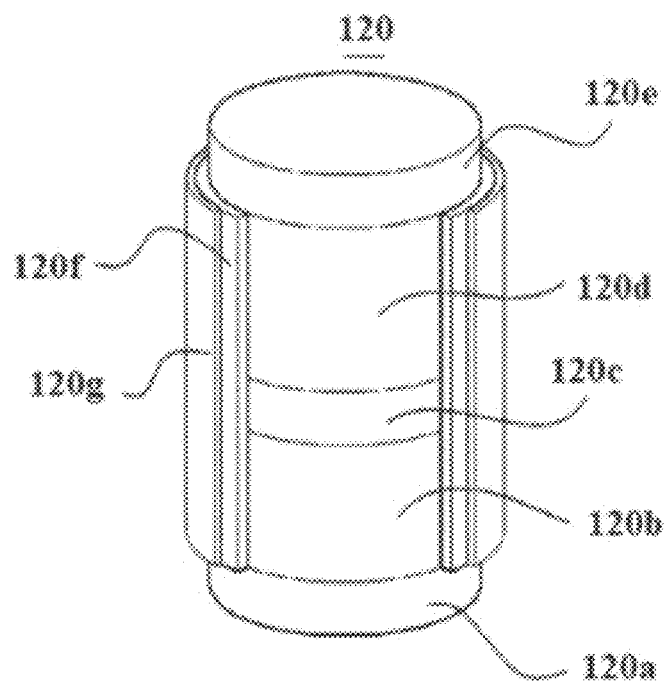
FIG. 5 is a perspective view of a nano-scale LED device included in an embodiment of the present invention.

In detail, FIG. 5 is a perspective view of a nano-scale LED device included in one implementation example of the present invention, the nano-scale LED device may include an active layer 120c formed on a first conductive semiconductor layer 120b and a second conductive semiconductor layer 120d formed on the active layer 120c, may further include a first electrode layer 120a formed on a lower surface of the first conductive semiconductor layer 120b, and may further include a second electrode layer 102e formed on an upper surface of the second conductive semiconductor layer 120d.

First, the first electrode layer 120a will be described.

For the first electrode layer 120a, a metal or metal oxide used as an electrode of a conventional LED device, preferably chromium (Cr), titanium (Ti), aluminum (Al), gold (Au), nickel (Ni), indium-tin-oxide (ITO), their oxide, their alloy, etc., may be used alone or in combination, but the present invention is not limited thereto. Preferably, a thickness of the first electrode layer may be 1 to 100 nm, but is not limited thereto. When the first electrode layer is included, the first electrode layer may be bonded at a temperature lower than that needed in a process of forming a metal ohmic layer in a connection portion of the first semiconductor layer and the electrode assembly.

Next, the first conductive semiconductor layer 120b formed on the first electrode layer 120a will be described. For example, the first conductive semiconductor layer 120b may include an n-type semiconductor layer. When the nano-scale LED device is a blue LED device, the n-type semiconductor layer may be selected from semiconductor materials having the empirical formula $In_xAl_yGa_{1-x-y}N$ ($0 \leq x \leq 1$, $0 \leq y \leq 1$, $0 \leq x+y \leq 1$), for example, one or more of indium-aluminum-gallium-nitrogen (InAlGaN), gallium-nitrogen (GaN), aluminum-gallium-nitrogen (AlGaN), indium-gallium-nitrogen (InGaN), aluminum-nitrogen (AlN), indium-nitrogen (InN), etc., and may be doped with a first conductive dopant (for example, silicon (Si), germanium (Ge), tin (Sn), etc.). Preferably, a thickness of the first conductive semiconductor layer 120b may be 500 nm to 5 μm, but is not limited thereto. Since a color of the light of the nano-scale LED device is not limited to blue, other kinds of semiconductor materials included in Groups III to V may be used in the n-type semiconductor layer when the emitted color is different.

Next, the active layer 120c formed on the first conductive semiconductor layer 120b will be described. When the nano-scale LED device is a blue LED device, the active layer 120c may be formed on the first conductive semiconductor layer 120b, and may be formed to have a single or multiple quantum well structure. A clad layer (not shown) doped with a conductive dopant may be formed above and/or below the active layer 120c, and may be implemented as an AlGaN layer or an InAlGaN layer. In addition, a material such as AlGaN, AlInGaN, etc. may be used as the active layer 120c. When an electric field is applied, light may be generated by a recombination of electron-hole pairs in the active layer 120c. Preferably, a thickness of the active layer may be 10 to 200 nm, but is not limited thereto. The active layer may be formed to be diversely located according to a type of the LED device. Since a color of the light of the nano-scale LED device is not limited to blue, other types of semiconductor materials included in Groups III to V may be used for the active layer when the emitted color is different.

Next, the second conductive semiconductor layer 120d formed on the active layer 120c will be described. When the nano-scale LED device is a blue LED device, a second conductive semiconductor layer 102d may be formed on the active layer 120c, and be implemented by at least one p-type semiconductor layer, and the p-type semiconductor layer may be selected from a semiconductor material having an empirical formula $In_xAl_yGa_{1-x-y}N$ (0≤x≤1, 0≤y≤1, 0x+y≤1), for example, one or more of InAlGaN, GaN, AlGaN, InGaN, AlN, InN, etc., and a second conductive dopant (for example, magnesium (Mg), etc.) may be doped. Here, a light emitting structure may include the first conductive semiconductor layer 120b, the active layer 120c, and the second conductive semiconductor layer 102d as a final element, and further include another fluorescent substance layer, another active layer, another semiconductor layer, and/or another electrode layer on/below each layer. Preferably, a thickness of the second conductive semiconductor layer 120d may be 50 nm to 500 nm, but is not limited thereto. Since a color of the light of the nano-scale LED device is not limited to blue, semiconductor materials included in Groups III to V of other kinds may be used as the p-type semiconductor layer when the emitting color is different.

Next, the second electrode layer 120e formed on the second conductive semiconductor layer 102d will be described.

The second electrode layer 120e may use metal or metal oxide used as an electrode of a conventional LED device, desirably Cr, Ti, Al, Au, Ni, ITO, their oxide, their alloy, etc., alone or in combination, but is not limited thereto. Preferably, a thickness of the second electrode layer may be 1 nm to 100 nm, but is not limited thereto. When including the second electrode layer, the second electrode layer may be bonded using a temperature smaller than that needed in a process of forming a metal ohmic layer in a connection portion of the first semiconductor layer and the electrode assembly Meanwhile, the nano-scale LED device included in the nano-scale LED electrode assembly according to the present invention may include a coated insulating film 120f covering an outer surface including the active layer 120c of the nano-scale LED device in order to prevent a short circuit generated by contact between the active layer 120c of the nano-scale LED device and the electrode line.

In detail, in FIG. 13, the insulating film 120f may be coated on the active layer 120c and the outer surface of the nano-scale LED device, and preferably, the insulating film 120f may be coated on one or more of the first conductive semiconductor layer 120b and the second conductive semiconductor layer 120d in order to prevent a decline in durability of the nano-scale LED device due to damage of the outer surface of the semiconductor layer.

The insulating film 120f may perform a function of preventing the electrical short circuit generated by the contact of the active layer 120c included in the nano-scale LED device and the electrode. Further, the insulating film 120f may prevent the defect of the surface of the active layer 120c by protecting the outer surface including the active layer of the nano-scale LED device, and prevent a decline in the light emitting efficiency.

When each of the nano-scale LED devices is arranged and connected one by one between two different electrodes, the electrical short circuit generated by the contact of the active layer and the electrode may be prevented, but it may be difficult to substantially install the nano-scale LED devices in the electrode one by one. Accordingly, when causing the nano-scale LED devices to self-align between the two different electrodes by applying the power like the present invention, the nano-scale LED devices may perform a position change such as movement, alignment between the two different electrodes, and in this case, the active layer 120d of the nano-scale LED device may be in contact with the electrode assembly, and thus the electrical short circuit may be frequently generated.

Meanwhile, when implementing the electrode assembly by standing the nano-scale LED device on the electrode to be perpendicular to the electrode, the electrical short circuit generated by the contact of the active layer and the electrode assembly may not be generated. That is, the active layer and the electrode assembly may be in contact with each other only when the nano-scale LED device is not stood on the electrode and is lay down on the electrode, in this case, there may be a problem in which the nano-scale LED device is not connected to the two different electrodes, but the problem of the electrical short circuit may not be generated.

However, since the two different electrodes are formed to be spaced apart from each other on the same plane and the nano-scale LED device is connected to be lay down in parallel with the same plane on which the two electrodes are formed, the problem of the electrical short circuit by the contact of the active layer of the electrode of the nano-scale LED device which is not generated in the conventional art may be necessarily generated. Accordingly, in order to prevent the problem, the insulating film covering the entire outer surface of at least the active layer of the outer surface of the nano-scale LED device may be needed.

Further, like the nano-scale LED device included in the electrode assembly according to the present invention, the active layer may be necessarily exposed outside in the nano-scale LED device having a structure in which the first semiconductor layer, the active layer, the second semiconductor layer are sequentially and vertically arranged. Moreover, in the LED device having the structure, since the active layer is not located only in the center in a longitudinal direction of the device and is formed to be located to lean towards the semiconductor layer, a possibility in which the electrode and the active layer are in contact with each other may be further increased. Accordingly, in order to achieve the purpose of the present invention, the insulating film maybe needed for allowing the device to be electrically connected to the two different electrodes regardless of the position of the active layer in the device.

Desirably, the insulating film (120f of FIG. 5) may include one or more of silicon nitride ($Si_3N_4$), aluminum oxide ($Al_2O_3$), hafnium oxide ($HfO_2$), yttrium oxide ($Y_2O_3$), titanium dioxide ($TiO_2$), and more preferably, consist of the ingredients or be transparent, but is not limited thereto. When the insulating film is transparent, the insulating film may perform the function of the insulating film (120f of FIG. 5), and also the decrease of the light emitting efficiency which may be generated by coating the insulating film may be minimized.

Meanwhile, according to one implementation example of the present invention, the insulating film (120f of FIG. 5)

may not be coated on one or more of the first electrode layer (120a of FIG. 5) and the second electrode layer (120e of FIG. 5) of the nano-scale LED device, and more preferably, the insulating film may not be coated on the two electrodes layer 120a and 120e. The two electrode layers 120a and 120e and different electrodes should be electrically connected, but when the insulating film 120f is coated on the two electrode layers 120a and 120e there may be a problem in which the light emission of the nano-scale LED is decreased or is not generated by the electrical disconnection since the electrical connection is obstructed. However, when there is the electrical connection between the two electrode layers of the nano-scale LED device 120a and 120e and the different electrodes, the insulating film 120f maybe included in portions of remaining electrode layers excluding end portions of the two electrode layers 120a and 120e of the two nano-scale LED devices since there is no problem in the light emission of the nano-scale LED device.

According to one implementation example of the present invention, the nano-scale LED device may further include a hydrophobic film (120g of FIG. 5) on the insulating film (120f of FIG. 5). The hydrophobic film 120g may perform a function of preventing an agglomeration phenomenon between the LED devices by allowing a surface of the nano-scale LED device to have a hydrophobic characteristic, remove a problem of hindering the characteristic of an independent nano-scale device by minimizing agglomeration between the nano-scale devices when the nano-scale LED devices are mixed in a solvent, and each of the nano-scale LED device may be easily aligned more when applying the power to the electrode assembly.

The hydrophobic film (120g of FIG. 5) may be formed on the insulating film (120f of FIG. 5). In this case, some hydrophobic films capable of preventing the agglomeration phenomenon between the nano-scale devices by being formed on the insulating film may be used without limitations, and preferably, self-assembled monolayers (SAMs) such as octadecyltrichlorosilane (OTS), fluoroalkyltrichlorosilane, perfluoroalkyltriethoxysilane, etc., and pluoropolymers such as teflon, cytop, etc., alone or in combination, may be used for the hydrophobic film, but the hydrophobic film is not limited thereto.

Meanwhile, according to a second implementation example according to the present invention, in a nano-scale LED electrode assembly including an electrode line including a first installation electrode and a second installation electrode which are spaced apart from each other on the same plane, and a plurality of nano-scale LED devices in which one end of the device in a longitudinal direction is in contact with the first installation electrode and the other end of the device is in contact with the second installation electrode, the nano-scale LED electrode assembly may emit light in which a polarization ratio according to the following Equation 1 is 0.25 or more.

$$\rho = \frac{I_{max} - I_{min}}{I_{max} + I_{min}} \qquad \text{[Equation 1]}$$

In Equation 1, $I_{max}$, and $I_{min}$ represent a maximum intensity and a minimum intensity of the light measured while rotating a polarization axis of a polarizer from −90° to +90° after installing the polarizer on a light emitting surface of the nano-scale electrode assembly.

As described above, the nano-scale LED electrode assembly according to the present invention may emit the partially polarized light close to the linearly polarized light having any one direction since the devices installed on the electrode are substantially connected in parallel in the longitudinal direction, and more preferably, be connected on the electrode so that the longitudinal direction is perpendicular to the electrode. Accordingly, the polarization ratio by Equation 1 may be 0.25 or more, more preferably 0.40 or more, and much more preferably 0.54 or more.

When describing the polarization ratio by Equation 1 in detail, the polarization ratio may mean a ratio related to the maximum intensity and the minimum intensity of the light measured while rotating the polarization axis of the polarizer within −90°~+90° after positioning the polarizer on an upper surface of the nano-scale LED electrode assembly, and when the polarization ratio is 1, $I_{min}$ means 0, and the light emitted from the nano-scale electrode assembly may mean the light which is completely and linearly polarized in a specific direction. When the polarization ratio is 0, the light emitted from the nano-scale LED electrode assembly may mean that the light having the same intensity is emitted regardless of an angle formed by the nano-scale LED device and the polarization axis of the polarizer since the light emitted from the nano-scale LED electrode assembly is not polarized.

The nano-scale LED electrode assembly according to the present invention may emit the polarized light further close to light that is linearly polarized since the alignment of the devices is very excellent, and the nano-scale LED electrode assembly according to the present invention having the very excellent alignment may greatly be suitable for various applications required to emit the polarized light since emitting the light in which the polarization ratio is 0.25 or more without including a separate polarizer may be recognized as emitting the light having an excellent polarization ratio in this art.

Figure 6A:
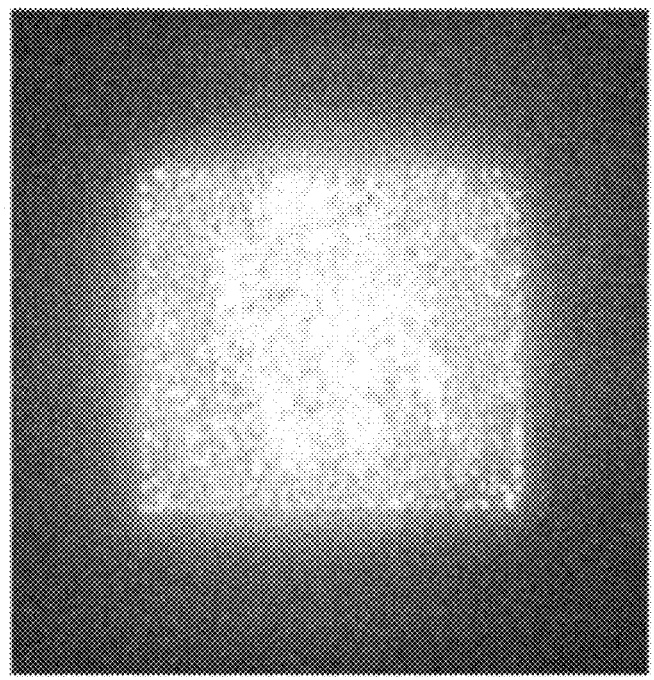
FIG. 6A is a photograph of light emission in a darkroom when driving power is applied to a nano-scale LED electrode assembly according to an embodiment of the present invention.
Figure 6B:
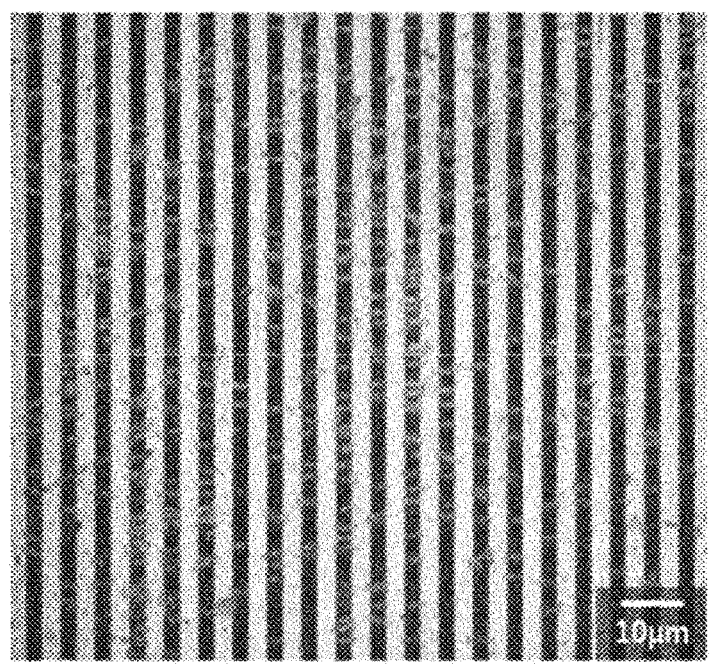
FIG. 6B is an optical microscope photograph of a nano-scale LED electrode assembly under the same conditions.
Figure 6C:
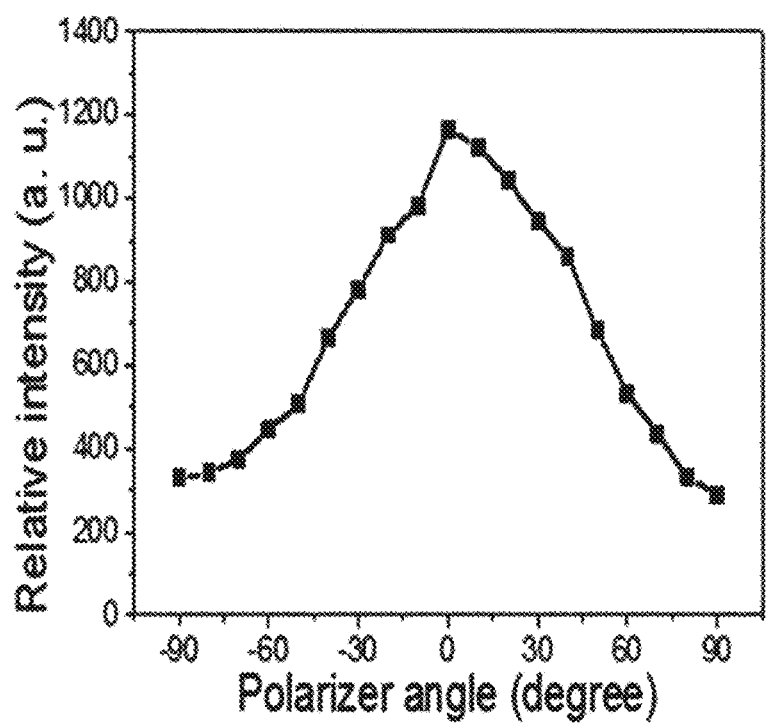
FIG. 6C is a graph illustrating a relative intensity of light passing through a polarizer according to a polarizer rotation angle.
Figure 7A:
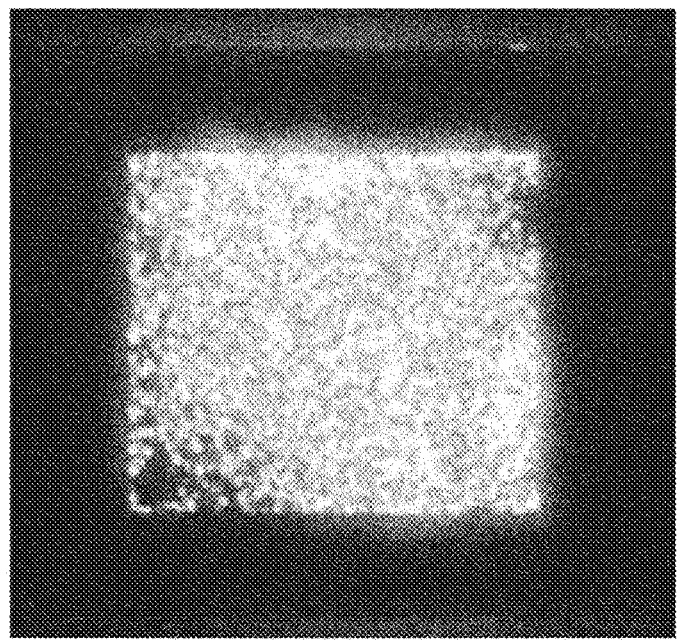
FIG. 7A is a photograph of light emission in a darkroom when driving power is applied to a nano-scale LED electrode assembly according to an embodiment of the present invention.
Figure 7B:
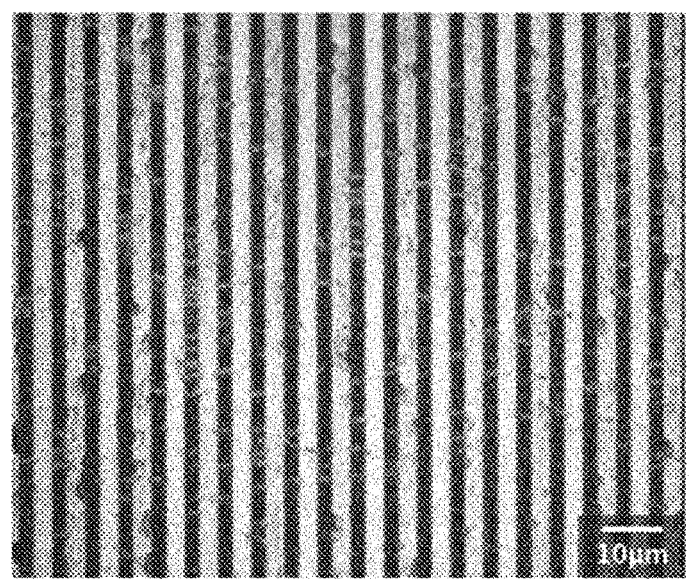
FIG. 7B is an optical microscope photograph of a nano-scale LED electrode assembly under the same conditions.
Figure 7C:
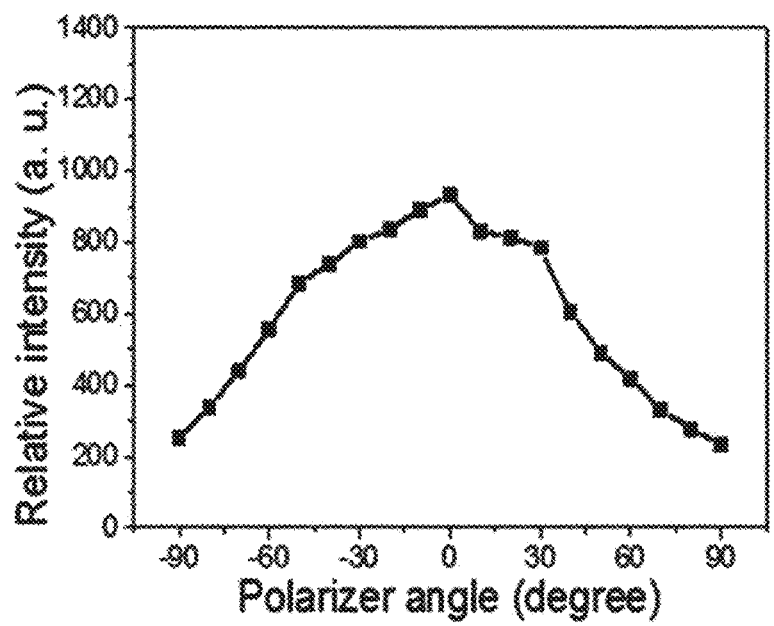
FIG. 7C is a graph illustrating a relative intensity of light passing through a polarizer according to a polarizer rotation angle.
Figure 8A:
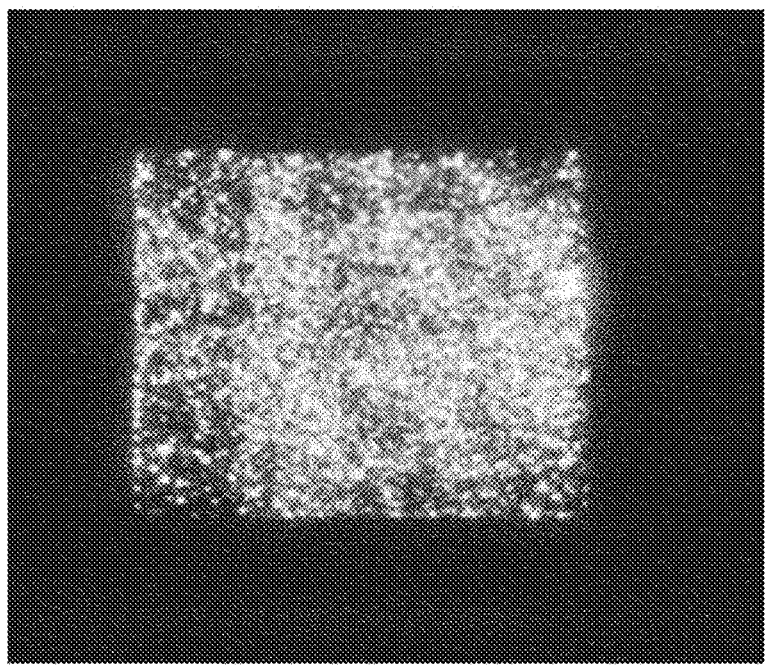
FIG. 8A is a photograph of light emission in a darkroom when driving power is applied to a nano-scale LED electrode assembly according to an embodiment of the present invention.
Figure 8B:
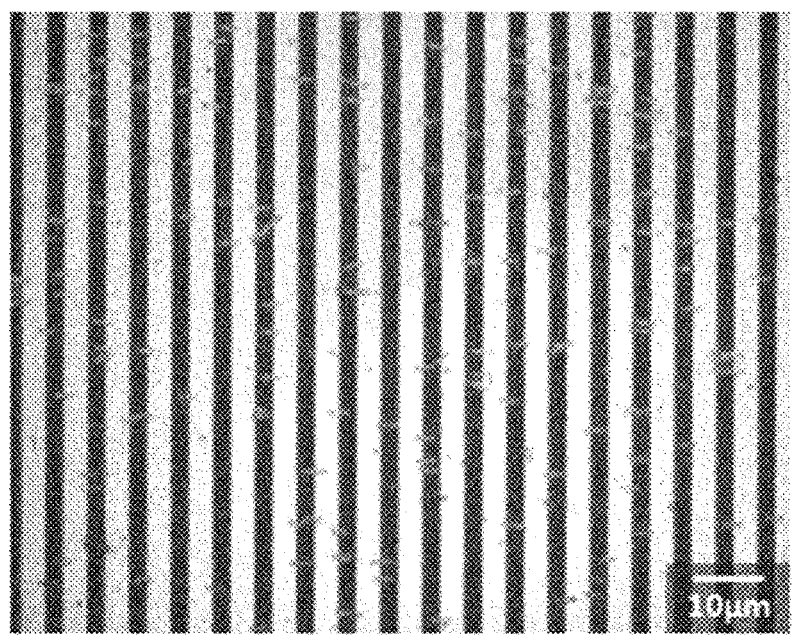
FIG. 8B is an optical microscope photograph of a nano-scale LED electrode assembly under the same conditions.
Figure 8C:
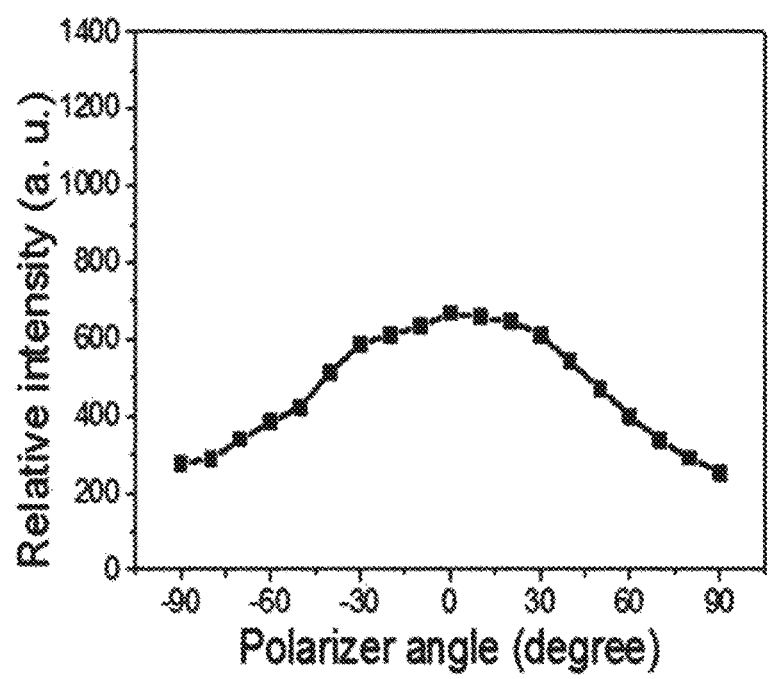
FIG. 8C is a graph illustrating a relative intensity of light passing through a polarizer according to a polarizer rotation angle of a nano-scale LED electrode assembly according to a comparison example of the present invention.
Figure 13A:
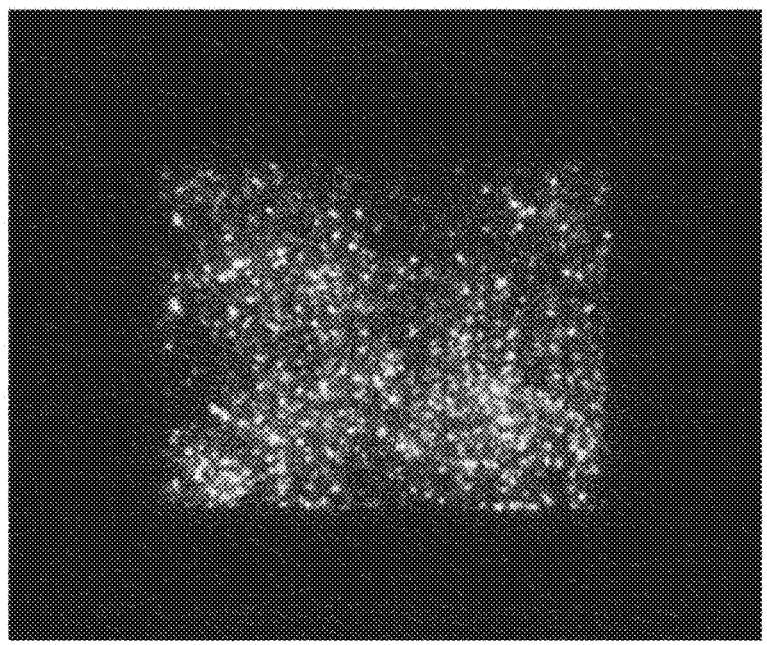
FIG. 13A is a photograph of light emission in a darkroom when driving power is applied to a nano-scale LED electrode assembly according to an embodiment of the present invention.
Figure 13B:
FIG. 13B is an optical microscope photograph of a nano-scale LED electrode assembly under the same conditions.
Figure 13C:
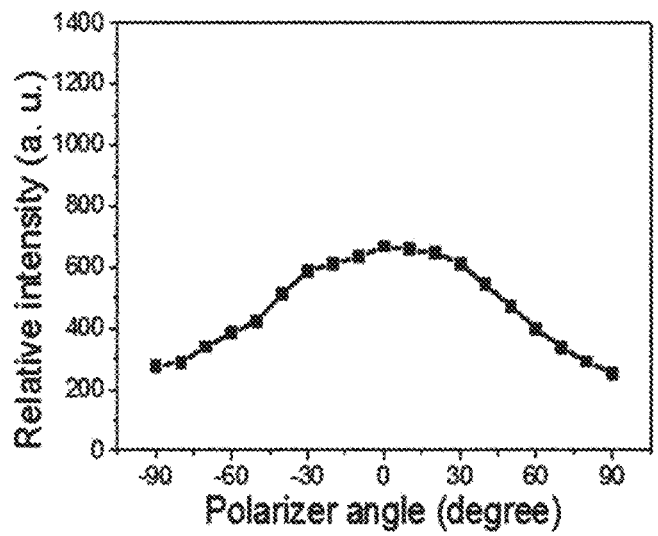
FIG. 13C is a graph illustrating a relative intensity of light passing through a polarizer according to a polarizer rotation angle.

In detail, FIGS. 6C, 7C, 8C, and 13C are results obtained by measuring a polarizer degree of the light emitted from the nano-scale LED electrode assembly according to various implementation examples of the present invention, it may be known that the intensity of the emitted light is great when an angle formed by the nano-scale LED device and the polarization axis of the polarizer is close to 0° in the nano-scale LED electrode assemblies shown in FIGS. 6C, 7C, 8C, and 13C, and the intensity of the emitted light is small as the angle is changed from 0 to ±90°. Through the results, it may be clearly confirmed that the nano-scale LED electrode assemblies shown in FIGS. 6C, 7C, 8C, and 13C emit the polarized light when applying the driving power, and in detail, emit the light in which the polarized light is excellent as the polarization ratio of the nano-scale LED electrode assembly shown in FIG. 6C is 0.61, the polarization ratio of the nano-scale LED electrode assembly shown in FIG. 7C is 0.60, the polarization ratio of the nano-scale LED electrode assembly shown in FIG. 8C is 0.45, and the polarization ratio of the nano-scale LED electrode assembly shown in FIG. 13C is 0.45.

Meanwhile, the nano-scale LED electrode assembly according to a third implementation example according to the present invention satisfies that the average installation angle of all of the nano-scale LED devices emitting in the nano-scale LED electrode assembly when applying the driving power is 30° or less, preferably 20° or less, more preferably 10° or less, much more preferably 5° or less.

In this case, since the average installation angle has the same meaning as the average installation angle in the first implementation example described above, and a description regarding the method of calculating the average installation angle will be omitted.

More preferably, the installation angle of each of the nano-scale LED device may be close to 0°, in this case, the nano-scale LED devices installed in the nano-scale LED electrode assembly may be most densely installed in the electrode line, and the light emitted from the nano-scale LED device may be the linearly polarized light having any one direction since the alignment of the devices is very excellent. When the average installation angle of the emitting nano-scale LED devices is more than 30°, the number of devices installed in a unit area of the installation electrode line may be remarkably decreased since the alignment on the installation electrode of the devices is not good, polarization directions of the light emitted from the devices are different from each other when applying the driving voltage to the nano-scale LED electrode assembly, and thus the nano-scale LED device maybe difficult to emit the partially polarized light close to the linearly polarized light having any one direction.

Figure 9:
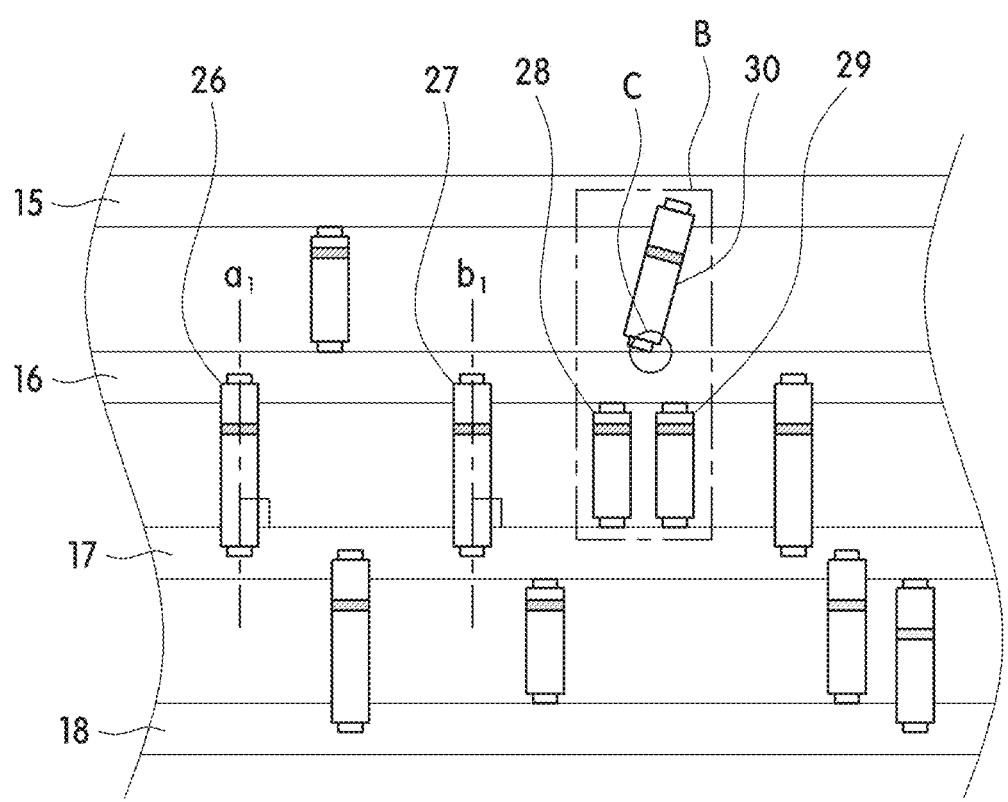
FIG. 9 is a planar diagram illustrating a nano-scale LED electrode assembly according to an embodiment of the present invention.

Referring to FIG. 9, when an angle formed by a longitudinal axis direction al of a sixth nano-scale LED device 26 and a first installation electrode 17 is 90°, and an angle formed by the longitudinal axis direction bi of a seventh nano-scale LED device 27 and the first installation electrode 17 is 90°, and the number of nano-scale LED devices installed in a limited region B may be remarkably increased as being confirmed from the portion B in FIG. 9 when the installation electrode and the longitudinal direction of the device are installed to be vertical or close to verticality like the sixth nano-scale LED device 26 and the seventh nano-scale LED device 27. That is, at least two or more nano-scale LED devices 28 and 29 may be installed in a region occupied by a tenth nano-scale LED device 30 obliquely connected to the first installation electrode 15 and the second installation electrode 16, and through this, when the nano-scale LED device is installed so that the electrode and the longitudinal direction of the device are vertical, a region in which the nano-scale LED device is able to be installed is increased, the number of devices which is actually installed is increased, the amount of emitted light is increased, and thus the emitted light may be the linearly polarized light having any one direction Further, when the installation electrode and the longitudinal direction of the device are connected to close to the verticality, a contact area between the end portion of the device and the installation electrode may be increased, and thus the electrical connectivity may be increased. Since an edge c of one end of the device is slightly connected over the installation electrode 16, a tenth nano-scale LED device 30 shown in FIG. 9 may be easily disconnected, and thus the electrical defect may be generated.

Hereinafter, a method of manufacturing the nano-scale LED electrode assemblies according to the first to third implementation examples of the present invention will be described. The present invention is not limited to the method which will be described hereinafter.

The nano-scale LED electrode assembly according to one implementation example of the present invention may manufacture the nano-scale LED electrode assembly including (1) injecting solution including a plurality of nano-scale LED devices into a base substrate, and an electrode line including a first installation electrode formed on the base substrate and a second installation electrode formed to be spaced apart from each other on the same plane as the first installation electrode, and (2) causing the plurality of nano-scale LED devices to self-align by applying power to the electrode line in order to connect end portions of the nano-scale LED devices to the first installation electrode and the second installation electrode, respectively, and the power may be alternating current power which has a voltage of 10 to 500 $V_{pp}$ and a frequency of 50 kHz to 1 GHz.

First, as the operation (1) according to the present invention, (1) the injecting of the solution including the plurality of nano-scale LED devices into the base substrate, and the electrode line including the first installation electrode formed on the base substrate and the second installation electrode formed to be spaced apart from each other on the same plane as the first installation electrode will be described.

Figure 10A:
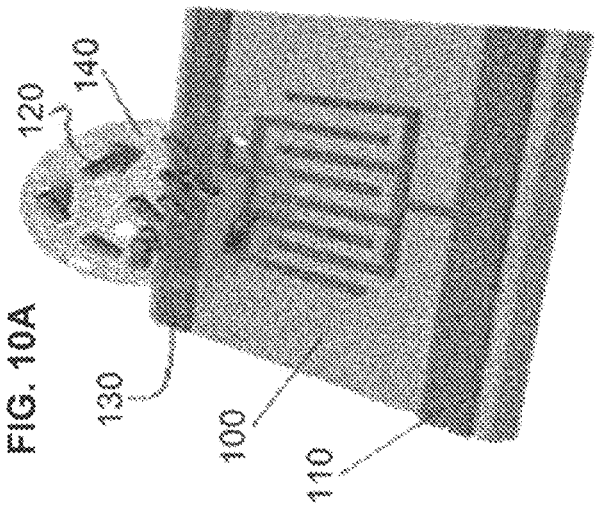
FIGS. 10A through 10C are diagrams illustrating a process of manufacturing a nano-scale electrode assembly according to an embodiment of the present invention.
Figure 10B:
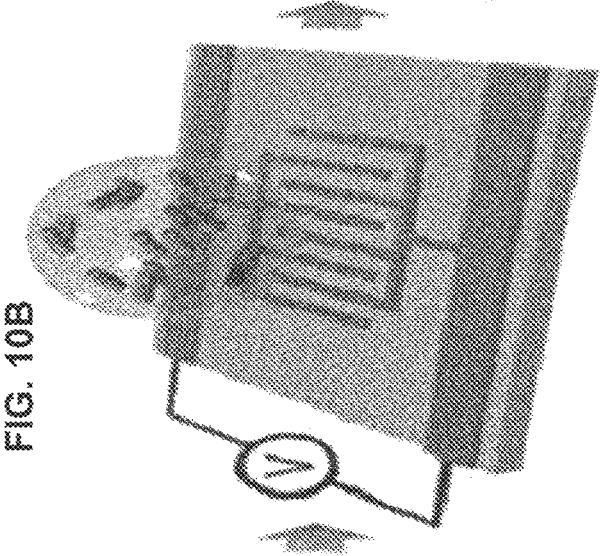
Figure 10C:
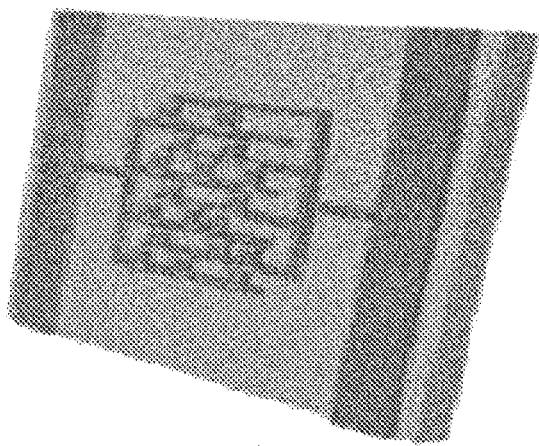

In detail, FIGS. 10A through 10C are diagrams illustrating a process of manufacturing a nano-scale electrode assembly according to one implementation example of the present invention, FIG. 10A illustrates a first installation electrode 110 formed on a base substrate 100, a second installation electrode 130 formed to be spaced apart from each other on the same plane as the first installation electrode, and a solution (an LED device 120, a solvent 140) in which the plurality of nano-scale LED devices are included.

Since a description regarding detailed manufacturing method and structure of the electrode line including the base substrate, the first installation electrode, and the second installation electrode is referenced by Korean Patent Registration No. 10-1429095, and Korean Patent Application No. 2014-0085384, the manufacturing method will be mainly described in detail hereinafter.

First, the solution 140 including the plurality of nano-scale LED devices will be described.

The solution 140 including the nano-scale LED devices may be manufactured by mixing the plurality of nano-scale LED devices 120 and the solution 140. The solution may be ink, or a paste. Preferably, the solution 140 may be any one selected from a group consisting of acetone, water, alcohol, toluene, more desirable acetone. A kind of the solution 140 is not limited thereto, and any solution capable of well evaporating without having a physical or chemical effect on the nano-scale LED device 120 will be used without limitations.

Preferably, the nano-scale LED devices may be included at a content of 0.001 to 100 parts by weight, based on 100 parts by weight of the dispersion solvent. When the nano-scale LED devices are included at a content of less than 0.001 parts by weight, the number of the nano-scale LED devices connected to the electrodes may be reduced, which makes it difficult to exert normal functions of the nano-scale LED electrode assembly. To solve the problems, the dispersion solution may be added dropwise several times. When the content of the nano-scale LED devices is greater than 100 parts by weight, an arrangement between the plurality of nano-scale LED devices may be disturbed.

Meanwhile, the operation (1) according to the present invention which is the injecting of the solution including the nano-scale LED devices into the electrode line including the first installation electrode and the second installation electrode may include 1-1) manufacturing an electrode line including a base substrate, a first installation electrode formed on the base substrate, and a second installation electrode formed to be spaced apart from each other on the same plane as the first installation electrode; 1-2) forming an insulating barrier surrounding an electrode line region in which a nano-scale LED device is able to be installed on the base substrate; and 1-3) injecting the solution including a plurality of nano-scale LED devices into the electrode line region surrounded by the insulating barrier.

First, the operation 1-1) may include manufacturing the electrode line including the base substrate, the first installation electrode formed on the base substrate, and the second installation electrode formed to be spaced apart from each other on the same plane as the first installation electrode Next, the operation 1-2) may include forming the insulating barrier surrounding the electrode line region in which the nano-scale LED device is able to be installed on the base substrate.

The insulating barrier may perform a function of allowing the nano-scale LED devices to be able to be arranged in the electrode line region to be desired by preventing the solution including the nano-scale LED device from being diffused outside the electrode line region in which the nano-scale LED device is installed when the solution including the nano-scale LED devices is injected into the electrode line in the operation 1-3

The insulating barrier may be manufactured through a manufacturing method which will be described hereinafter, but the manufacture method of the insulating barrier is not limited thereto.

In detail, FIGS. 11A through 11F are diagrams illustrating a manufacturing process of forming a base substrate 100, and an insulating barrier 107 formed in an electrode line formed on the base substrate 100 according to one implementation example of the present invention, and the insulating barrier 107 may be manufactured after manufacturing the electrode lines 103a, 103b deposited on the base substrate 100 like FIG. 2f described above.

First, like FIG. 11A, an insulating layer 104 may be formed on the base substrate 100 and the electrode lines 103a and 103b formed on the base substrate 100. The insulating layer 104 may be a layer forming the insulating barrier after performing a process which will be described, and a material of the insulating layer 104 may be an insulating material which is generally used in the art, desirably any one or more among inorganic insulating materials such as $SiO_2$, $Si_3N_4$, $Al_2O_3$, $HfO_2$, $Y_2O_3$, $TiO_2$, and various transparent polymer insulating materials. A method of coating the inorganic insulating material on the base substrate 100, and the electrode lines 103a and 103b formed on the base substrate 100 may be anyone of chemical vapor deposition, atomic layer deposition, vacuum deposition, e-beam deposition, and spin coating methods, desirable the chemical vapor deposition method, but is not limited thereto. Further, a method of coating a polymer insulating layer may be any one of spin coating, spray coating, and screen printing methods, preferably, the spin coating method, but is not limited thereto, and a detailed coating method may be performed by a well-known method in the art. A thickness of the coated insulating layer 104 may be half of a radius of the nano-scale LED device so that the nano-scale LED device does not spill out and does not have an influence on a post process, and generally, be a thickness which is not able to have an influence on the pose process, preferably 0.1 to 100 μm, and more preferably 0.3 to 10 μm. When the thickness does not satisfy the range, there may be a problem in which it is difficult to manufacture a product including the nano-scale LED electrode assembly by having an influence on the post process, and when the thickness of the insulating layer is much smaller than a diameter of the nano-scale LED device, an effect of preventing spreadability of the nano-scale LED device through the insulating barrier may be decreased, and there may be a problem in which the solution including the nano-scale LED device spills over outside the insulating barrier.

After this, a photo resist (PR) 105 may be coated on the insulating layer 104. The photo resist may be a photo resist which is generally used in the art. A method of coating the photo resist on the insulating layer 104 may be any one of spin coating, spray coating, and screen printing methods, preferably, the spin coating method, but is not limited thereto, and a detailed method may be a well-known method in the art. A thickness of the coated photo resist 105 may be greater than that of the insulating layer coated by a mask used when etching, and accordingly, be 1 to 20 μm. The thickness of the coated photo resist 105 may be diversely changed according to a purpose later As described above, a mask 106 corresponding to a horizontal cross-sectional shape of the insulating barrier may be located on the photo resist layer 105 like FIG. 11C after forming the photo resist layer 105 on the insulating layer 104, and an ultraviolet ray may be exposed above the mask 106.

After this, a process of removing the exposed photo resist layer by soaking the exposed photo resist layer in a conventional photo resist solvent may be performed, and through this, the exposed photo resist layer corresponding to the electrode line region in which the nano-scale LED devices are installed like FIG. 11D may be removed.

Next, a process of removing the exposed insulating layer through the etching on a region of the insulating layer exposed by removing the photo resist layer may be performed. The etching may be a wet etching or a dry etching, preferably the dry etching. A detailed method of the etching may be a well-known method in the art. In detail, the dry etching may be any one or more of a plasma etching, a sputter etching, a reactive ion etching, and a reactive ion beam etching. However, a detailed etching method is not limited thereto. When removing the insulating layer exposed through the etching, the base substrate 100 and the electrode lines 103a and 103b may be exposed as shown in FIG. 11E.

Next, like FIG. 11F, when the photo resist layer 105 coated on the base substrate 100 is removed using any one photo resist remover among acetone, 1-methyl-2-pyrrolidone (NMP), and dimethyl sulfoxide (DMSO), an insulating barrier 104' may be manufactured in a region excluding a region (P of FIG. 11F) in which the nano-scale LED device is substantially installed on the base substrate 100.

Next, the operation 1-3) may include injecting the solution including the plurality of nano-scale LED devices into the electrode line region surrounded by the insulating barrier.

In detail, FIGS. 12A through 12C are perspective view illustrating a process of manufacturing a nano-scale electrode assembly according to one implementation example of the present invention, and as shown in FIG. 12A, the solution 140 including the plurality of nano-scale LED devices may be injected into the region of the electrode lines 110 and 130 surrounded by the insulating barrier 150 formed on the base substrate 100. In this case, compared with the case of FIG. 10A, the solution including the plurality of nano-scale LED devices may be directly positioned in a desired electrode line region. Further, there may be an advantage of preventing the nano-scale LED devices from being located in an electrode line region in which the nano-scale LED devices do not desire to be installed and/or a region in which the electrode lines are not present since the nano-scale LED devices spill over outside the electrode line in the solution after injecting the solution. Meanwhile, since a description related to FIGS. 12B and 12C is the same as that regarding FIGS. 10B and 10C in a description of the process (2) according to the present invention which will be described hereinafter, and a detailed description may be replaced by a content which will be described hereinafter.

Next, the first implementation example of the present invention may correspond to the process (2), and the process (2) may include causing the plurality of LED devices to self-align by applying the power to the electrode line in order to simultaneously connect the plurality of nano-scale LED devices to the first installation electrode and the second installation electrode as shown in FIG. 10B.

The plurality of nano-scale LED devices included in the nano-scale LED electrode assembly according to the present invention may be self-aligned by applying the power to the first installation electrode and the second installation electrode, and be simultaneously connected to the first installation electrode and the second installation electrode as shown in FIG. 10C.

In this case, in order to remarkably increase the number of nano-scale LED devices which are installed per a unit area by remarkably improving the alignment of the nano-scale LED devices which are installed by being self-aligned on the electrode, the power may be alternating current power in which a voltage is 10 to 500 $V_{pp}$, and a frequency is 50 kHz to 1 GHz, preferably, be the alternating current power having a sine wave, and more preferably, be the alternating current power having a sine wave in which the voltage is 35 to 200 $V_{pp}$, and a frequency is 90 kHz to 100 MHz When the voltage of the power is more than 500 $V_{pp}$, the number of nano-scale LED devices installed may be remarkably decreased, and there may be a problem in which a short circuit is generated in the electrode line when a high voltage has a great effect on the electrode, even when satisfying the frequency range. When the voltage is less than 10 $V_{pp}$, a smaller number of nano-scale LED devices may be installed compared with the voltage is excessive by a low voltage even when satisfying the frequency range, and also the alignment of the installed nano-scale LED devices may be remarkably decreased.

Further, even when satisfying the voltage range when the frequency is less than 50 kHz, the number of nano-scale LED devices installed maybe remarkably decreased, and there may be a problem in which the polarized light is not emitted since the alignment between the devices is very irregular. Moreover, when the frequency is more than 1 GHz, the alignment may be decreased since the nano-scale LED device does not adapt to the alternating current power which is quickly changed, and there may be a problem in which the polarized light is not emitted like the case in which the frequency is small.

In detail, in a condition such as a type, a voltage, and a frequency of power applying for the self alignment, the power may be power changed with an amplitude and a period, and a waveform of the power may be a pulse waveform configured as a sinusoidal wave such as a sine wave or pulse waveforms excluding the sinusoidal wave. Meanwhile, as the conventional power condition disclosed by the inventor of the present invention, a voltage (amplitude) of the power is 0.1 V to 1000V and the frequency is 10 Hz to 100 GHz, but the inventor of the present invention recognizes that the alignment of the nano-scale devices is increased, that is, the longitudinal directions of the devices are substantially close to parallel, and further, the longitudinal directions of the devices are close to be perpendicular to the installation electrode when having a specific wave, and specific voltage and frequency through a continuous study for further improving the alignment between the devices and the alignment with the installation electrode, the light having a high intensity is emitted as the longitudinal directions are close to be perpendicular to the installation electrode, and in this case, the emitted light is the polarized light, and on the contrary, the polarized light is not emitted even when the intensity of the emitted light is satisfied in some degree, or the polarized light is emitted but an entire intensity of the emitted light is decreased when the voltage is the same but the frequency is changed.

In detail, FIG. 8C is a graph illustrating a relative intensity of light passing through a polarizer according to a polarizer rotation angle of a nano-scale LED electrode assembly according to one implementation example of the present invention, it may be confirmed that a material in characteristic emitting the polarized light is excellent compared with the nano-scale LED electrode assembly shown in FIG. 8C. Since the polarization ratio is calculated as 0.45 according to Equation 1 described above in the graph shown in FIG. 8C, and the polarization ratio of the nano-scale LED electrode assembly according to FIG. 13C is calculated 0.55 according to Equation 1 described above.

However, when considering the intensity of the light in which the nano-scale LED electrode assembly emits overall, the nano-scale LED electrode assembly shown in FIG. 8A emits much brighter light when comparing FIGS. 8A and 13A, and it may be confirmed that the nano-scale LED electrode assembly shown in FIG. 8B has a greater number of nano-scale LED devices than the nano-scale LED electrode assembly shown in FIG. 13B through the optical microscope photographs shown in FIGS. 8B and 13B. Accordingly, even when the light having a desired level is emitted by the condition such as the voltage, the frequency, and the waveform of the power applied when causing the devices to self-align in FIG. 13A, it may be confirmed that the polarized light is decreased or light which is not the polarized light is emitted. Further, on the contrary, since the alignment of the devices installed is excellent as the number of devices is remarkably small, the light having the desired level may not be emitted even when the polarized light is emitted.

Meanwhile, the method of manufacturing the nano-scale LED electrode assembly according to one implementation example of the present invention may further include forming a metal ohmic layer in a connection portion of the first installation electrode, the second electrode, and the nano-scale LED device, as a process (3) after the process (2).

The plurality of nano-scale LED devices may emit the light when applying the power to the two different electrodes to which the plurality of nano-scale LED devices are connected, and in this case, a great resistance between the nano-scale LED devices may be generated, and thus the forming the metal ohmic layer may be further included in order to reduce the resistance.

The metal ohmic layer may be formed using any methods which are well known in the art, and the method of forming the metal ohmic layer is not limited thereto, and a description thereof will be omitted.

The nano-cell LED electrode assemblies according to the first to third implementation examples of the present invention described above may be applied to the polarized LED lamp.

In detail, the polarized LED lamp may include a supporter, and the nano-scale LED electrode assembly according to the present invention included inside the supporter.

Figure 14:
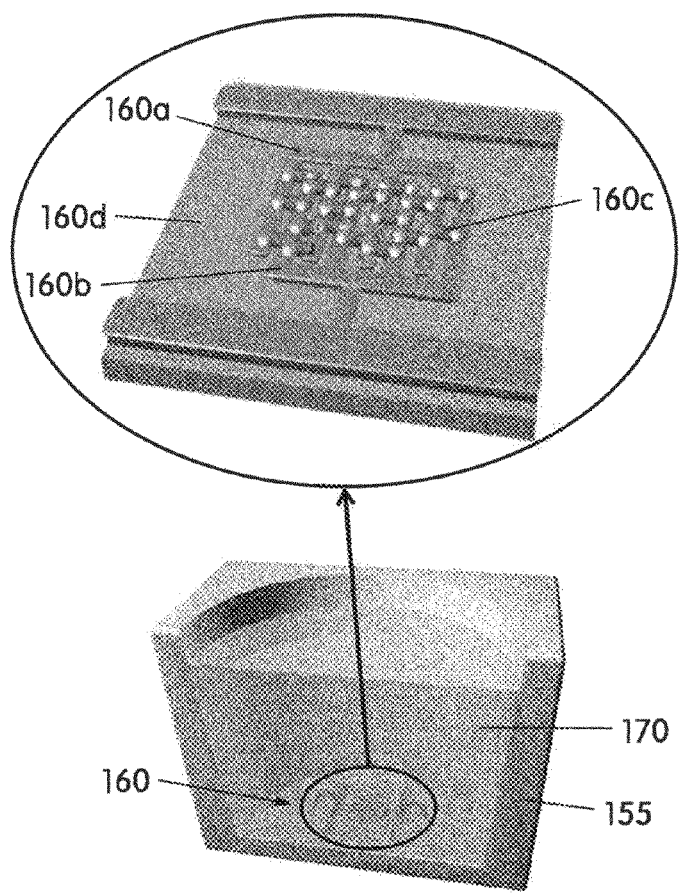
FIG. 14 is a cross-sectional view and a partially exploded view of a polarized LED lamp according to an embodiment of the present invention.

In detail, FIG. 14 is a cross-sectional view of a polarized LED lamp according to one implementation example of the present invention, at least one of the nano-scale LED electrode assemblies 160 may be included inside the supporter 155, and in this case, the nano-scale LED electrode assembly 160 may be included inside the supporter 155 by locating the base substrate 160d therebetween. Further, a fluorescent substance 170 may be included in a remaining space of the supporter 155.

Figure 15:
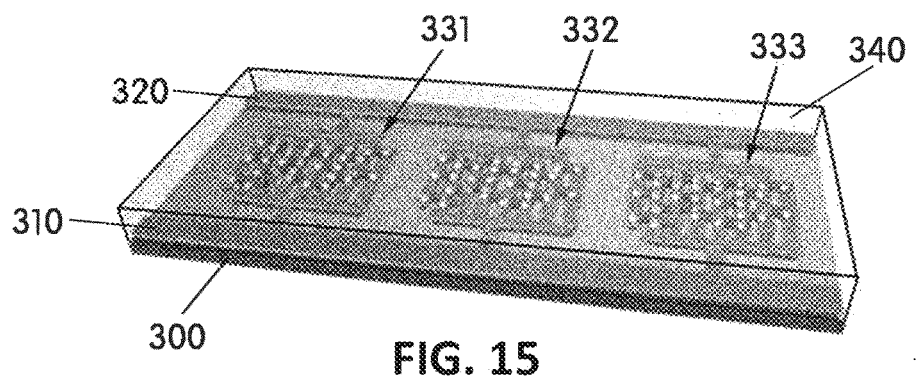
FIGS. 15 and 16 are perspective views of polarized LED lamps according to an embodiment of the present invention.
Figure 16:
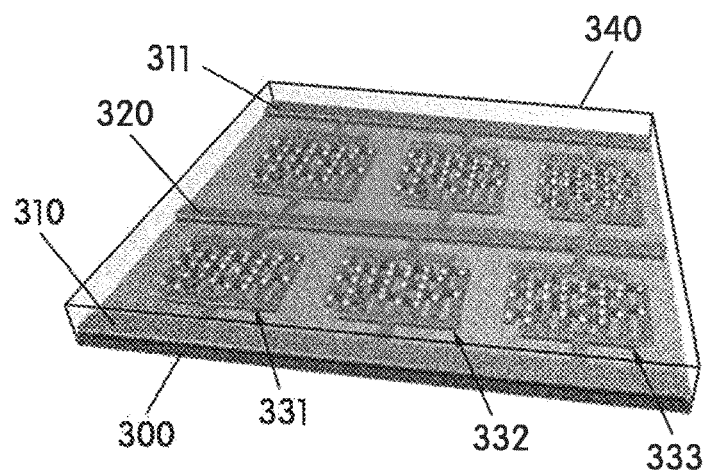
Figure 17:
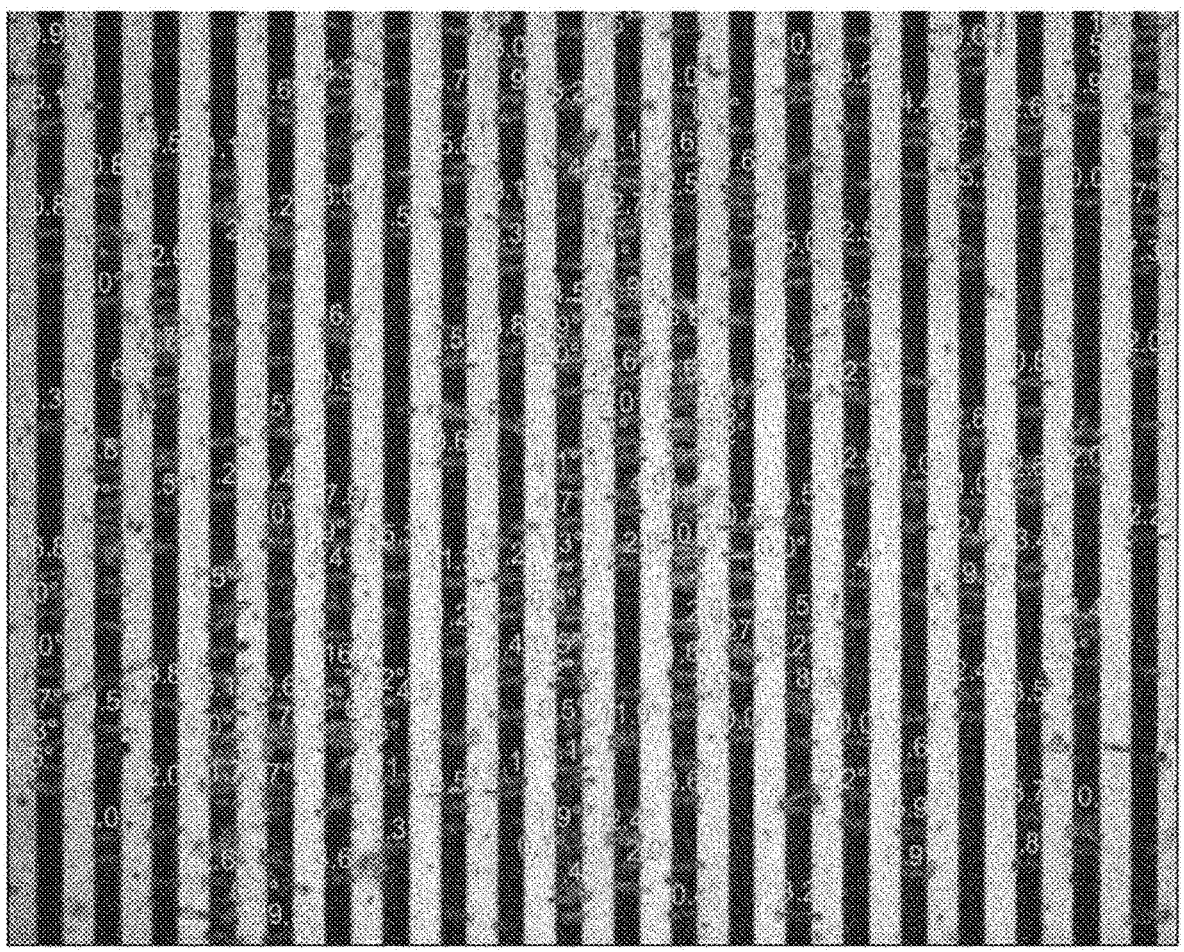
FIGS. 17 to 20 are diagrams illustrating measurements of an installation angle of a device in a nano-scale LED electrode assembly according to one implementation example of the present invention.
Figure 18:
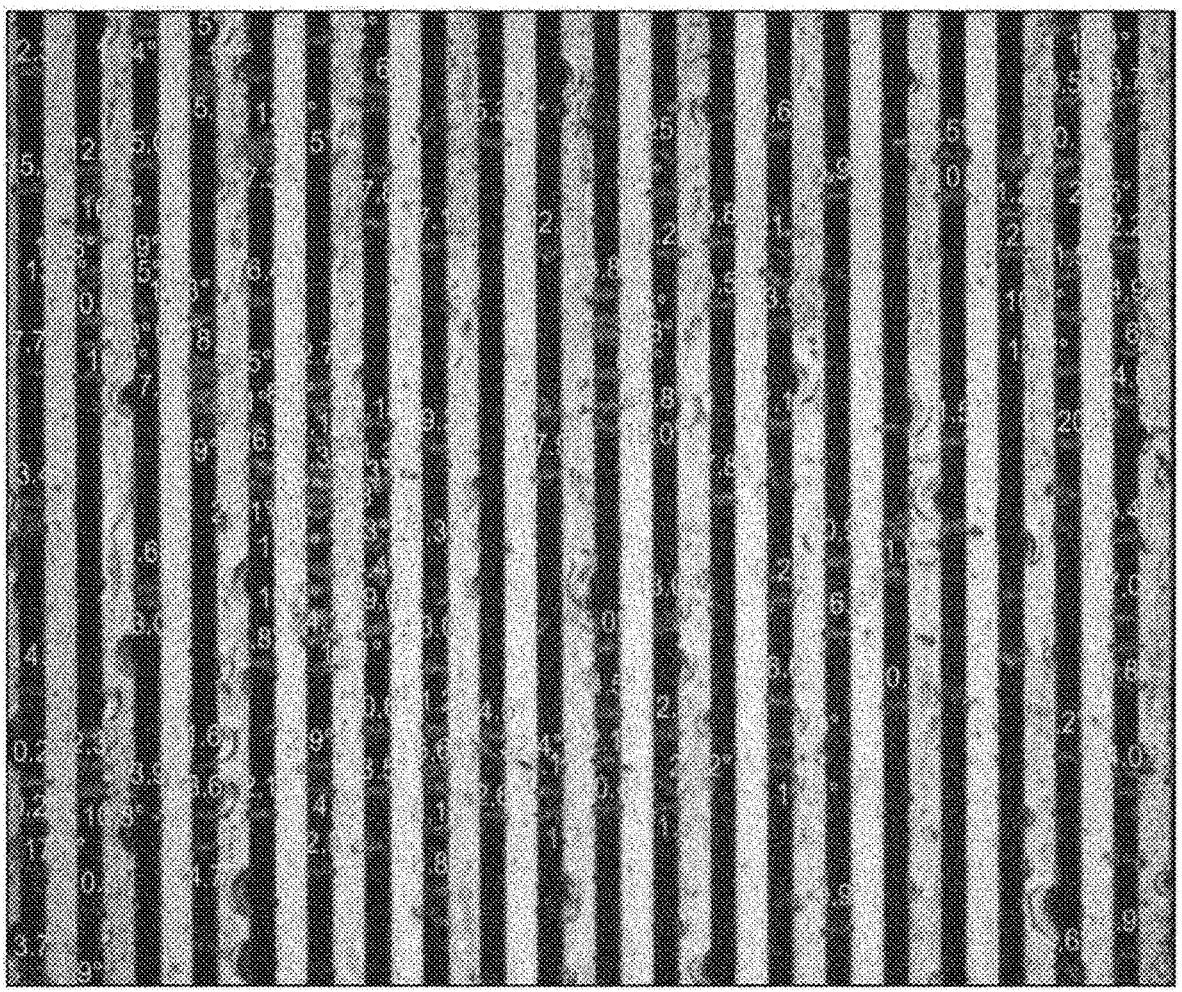
Figure 19:
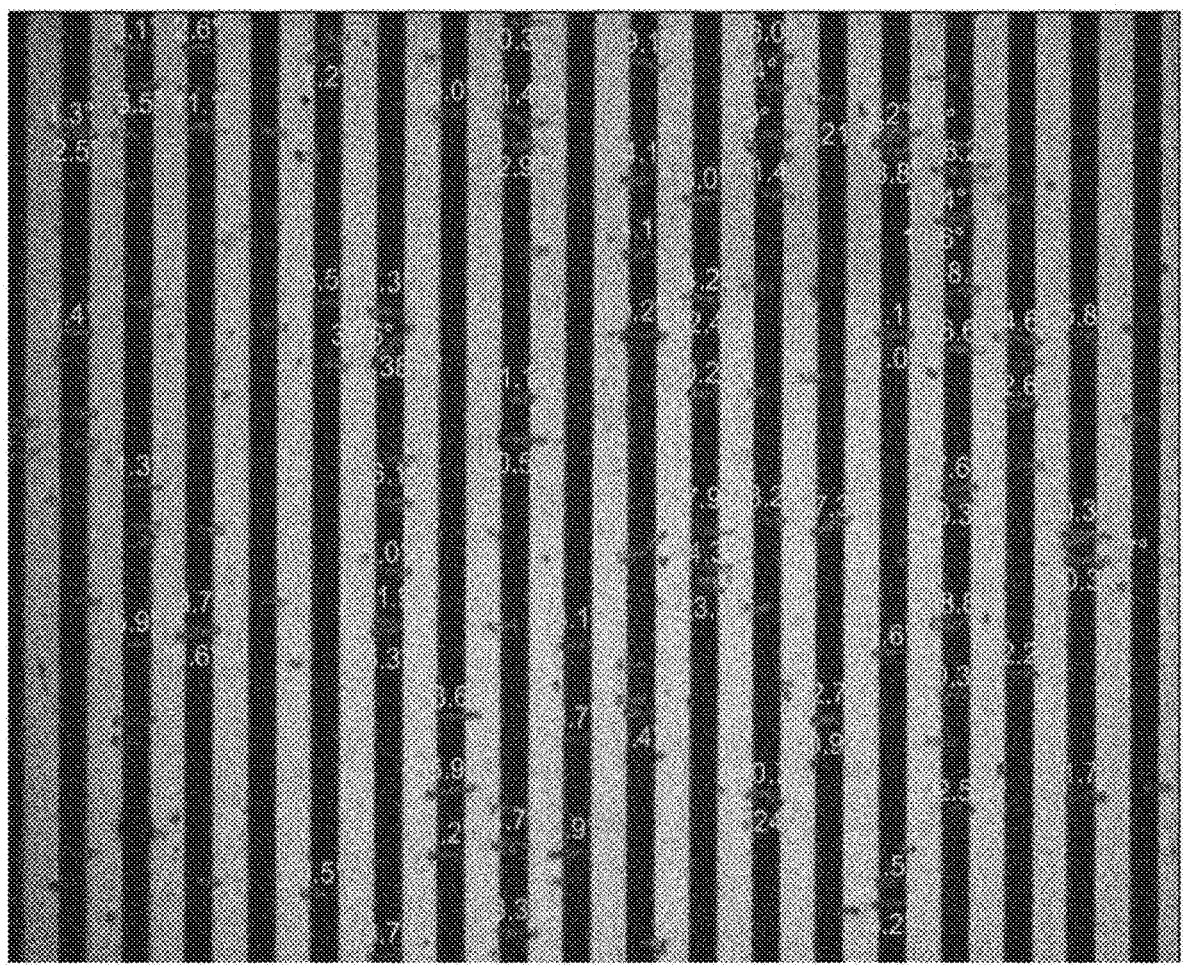
Figure 20:
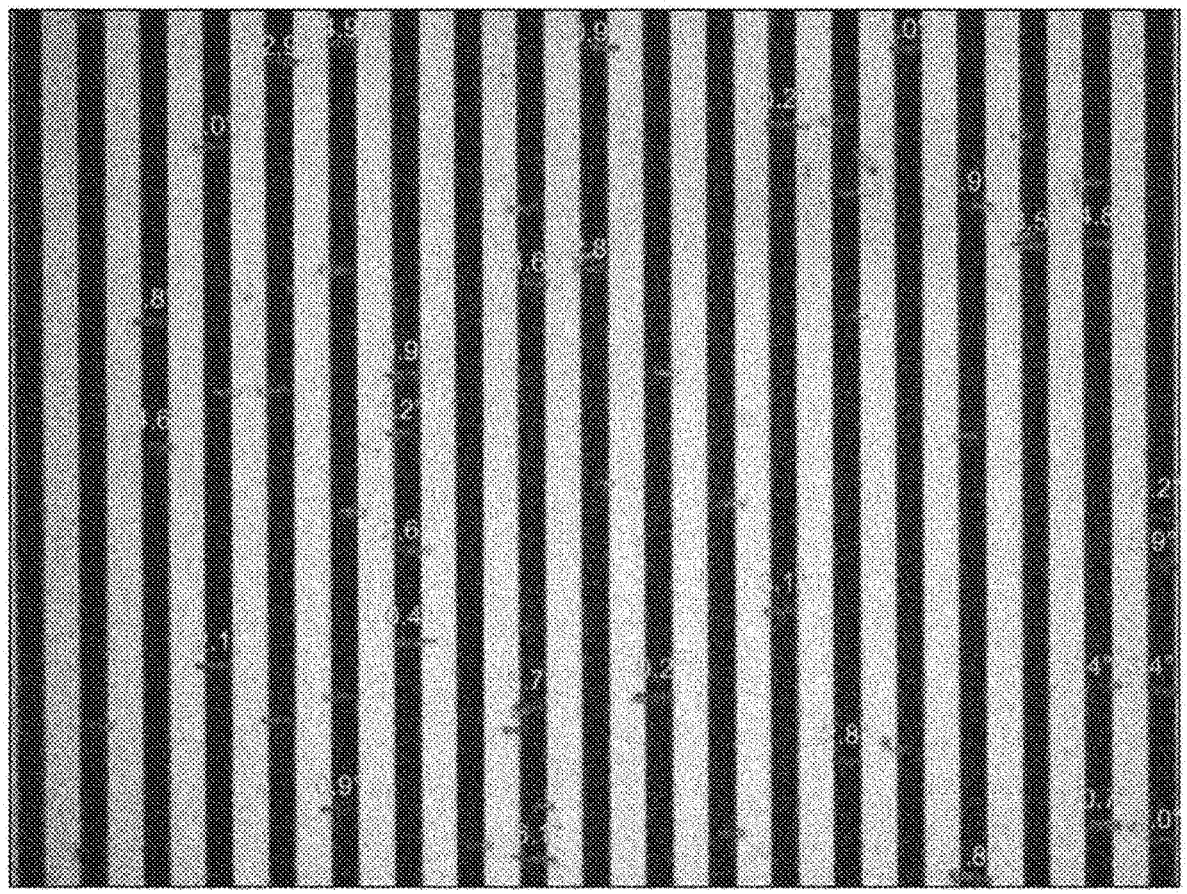

Further, in detail, FIGS. 15 and 16 are perspective views of polarized LED lamps according to implementation examples of the present invention, as shown in FIG. 15, a plurality of nano-scale LED electrode assemblies 331, 332, and 333 may be arranged on the supporter 300 so as to have a line arrangement, and as shown in FIG. 16, the plurality of nano-scale LED electrode assemblies 331, 332, and 333 may be arranged on the supporter 300 having a plane shape so as to have a plane arrangement.

First, the supporter 155 will be described. The supporter which is able to be used in the present invention may generally be any supporters used for the LED lamp without limitations, but preferably any one material selected from groups consisting of organic resins, ceramics, metals, and inorganic resins, and the material may be transparent or opaque. Further, a shape of the supporter may be a cup shape or flat plate shape, but is not limited thereto, and be not specially limited since the shape of the supporter is diversely designed according to a purpose.

When the supporter 155 has the cup shape, an internal volume may be diversely changed in proportion to a size and a density of the electrode in which the nano-scale LED devices are arranged. Further, the internal volume of the supporter may be changed according to a thickness of the supporter. The thickness of the supporter may be the same at every position of the supporter or be different at some positions. Since the thickness of the supporter is diversely designed according to a purpose, it is not specially limited.

Next, the base substrate 160d will be described. A material of the base substrate 160d may be any one selected from groups consisting of glass, plastic, ceramic, and metal, but is not limited thereto. The base substrate 160d may use the same material as the supporter 150, and the base substrate and the supporter may use a one-piece material. Preferably, the base substrate may be transparent. Further, preferably, the base substrate may use a flexible material. A dimension of the base substrate in the nano-scale LED electrode assembly is not specially limited, and a size of the base substrate may be changed from micro units to meter units according to whether an application is a point light source or a surface light source. The thickness of the base substrate maybe 10 μm to 1 mm, but is not limited thereto, and may be changed according to the material and the internal volume of the supporter 150 in which the base substrate 160d is located, the arrangement of the electrodes formed on the base substrate or an area of the electrode region of the arranged electrode which will be described hereinafter.

Further, preferably, the nano-scale LED electrode assembly according to one implementation example of the present invention may include one of a nano-scale UV LED device, a nano-scale blue LED device, a nano-scale green LED device, a nano-scale yellow LED device, a nano-scale amber LED device, and a nano-scale red LED device. Through this, one implementation example of the present invention may be an LED lamp in which any one among UV light, blue light, green light, yellow light, amber light, and red light is emitted.

Further, according to one implementation example of the present invention, a fluorescent substance included inside the supporter and excited by the light emitted from the nano-scale LED devices may be further included.

As an example, when the nano-scale LED device is the nano-scale UV LED device, preferably, the fluorescent substance excited by the UV maybe a fluorescent substance which is any one among blue, yellow, green, amber, and red, and in this case, the nano-scale LED device may be a monochrome LED lamp emitting the selected any one color. Further, preferably, the fluorescent substance excited by the UV may be one or more among blue, yellow, green, amber, and red, more preferably a mixed fluorescent substance of any one type among blue/yellow, blue/green/red, and blue/green/amber/red, and in this case, white light may be emitted by the fluorescent substance.

A detailed type of the fluorescent substance which is able to be mixed may be changed according to a color emitted from the nano-scale LED device, and since the mixture may be a well-known mixture, and the fluorescent substance is not specially limited in the present invention.

As an example, when the nano-scale LED device is the nano-scale blue LED device, preferably, the fluorescent substance excited by blue may be a fluorescent substance which is any one or more among yellow, green, amber, and red. More preferably, when the fluorescent substance may be a mixed fluorescent substance of any one type of mixed fluorescent substances such as blue/yellow, blue/green/red, and blue/green/amber/red, and in this case, white light may be emitted by the fluorescent substance. Preferably, the yellow fluorescent substance may be any one or more selected from groups consisting of $Y_3Al_5O_{12}$:Eu, $Lu_3Al_5O_{12}$:Eu, $(Sr,Ba)_3SiO_5$:Eu, $(Sr,Ba,Ca)_2SiO_4$:Eu, Ca-α-SiAlON:Eu, and $(Ba,Eu)ZrSi_3O_9$. Preferably, the blue fluorescent substance maybe any one or more selected from groups consisting of ZnS:AgCl, ZnS:AgAl, $(Sr,Ba,Ca,Mg)_{10}(PO_4)_6Cl_2$:Eu, $(Ba,Sr)MgAl_{10}O_{17}$:Eu, $BaMgAl_{10}O_{17}$:Eu, $(Sr,Ba)_3MgSi_2O_8$:Eu, $LaSi_3N_5$:Ce, $LaSi_5Al_2ON_9$:Eu, $Sr_2MgSi_2O_7$:Eu, $CaMgSi_2O_6$:Eu. Preferably, the green fluorescent substance maybe any one or more selected from groups consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4Ce,Li$, β-SiALON:Eu, $CaSc_2O_4$:Ce, $Ca_3Sc_2Si_3O_{12}$:Ce, Ca-α-SiALON:Yb, Ca-α-SiALON:Eu, Li-α-SiALON:Eu, $Ta_3Al_5O_{12}$:Ce, $Sr_2Si_5N_8$:Ce, $(Ca,Sr,Ba)Si_2O_2N_2$:Eu, $Ba_3Si_6O_{12}N_2$:Eu, γ-AlON:Mn, and γ-AlON:Mn,Mg. Preferably, the amber fluorescent substance may be any one or more selected from groups consisting of $(Sr,Ba,Ca)_2SiO_4$:Eu, $(Sr,Ba,Ca)_3SiO_5$:Eu, and $(Ca,Sr,Ba)_2Si_5N_8$:Eu. Preferably, the red fluorescent substance may be any one or more selected from groups consisting of $(Sr,Ca)AlSiN_3$:Eu, $CaAlSiN_3$:Eu, $(Sr,Ca)S$:Eu, $CaSiN_2$:Ce, $SrSiN_2$:Eu, $Ba_2Si_5N_8$:Eu, CaS:Eu, CaS:Eu,Ce, SrS:Eu, SrS:Eu,Ce, and $Sr_2Si_5N_8$:Eu. The detailed type of the fluorescent substance for each color described above is not limited thereto in the present invention.

Further, when the fluorescent substance is not included, the inside of the supporter may be filled with any one or more materials among transparent silicon binder, organic polymer, inorganic polymer, a glass material, but the materials are not limited thereto.

According to one implementation example of the present invention, the plurality of nano-scale LED electrode assemblies may be included in the inside of the supporter.

Preferably, the plurality of nano-scale LED electrode assemblies may be arranged to have the line arrangement or the plane arrangement. However, the arrangement of the plurality of nano-scale LED assemblies is not limited thereto, and a shape of the detailed arrangement of the plurality of nano-scale LED assemblies may be changed according to a shape of the supporter and/or a use purpose of the LED lamp in which the nano-scale electrode assembly is included.

Each of the plurality of nano-scale LED electrode assemblies may independently include any one among a nano-scale UV LED device, a nano-scale blue LED device, a nano-scale green LED device, a nano-scale yellow LED device, a nano-scale amber LED device, and a nano-scale red LED device. Accordingly, various colors may be emitted by including two or more nano-scale electrode assemblies among a nano-scale blue LED electrode assembly, a nano-scale green LED electrode assembly, a nano-scale red LED electrode assembly, a nano-scale amber LED electrode assembly, and a nano-scale yellow LED electrode assembly thereby polarized LED lamp emitting polarized light may be implemented. Further, the white polarized LED lamp may be implemented by including a plurality of the nano-scale blue LED electrode assembly, the nano-scale green LED electrode assembly, and the nano-scale red LED electrode assembly.

As a detailed implementation example capable of implementing the white polarized LED lamp, the white polarized LED lamp may be implemented by including a transparent resin layer from which the fluorescent substance is removed in the supporter by configuring using the nano-scale blue LED electrode assembly, the nano-scale green LED electrode assembly, the nano-scale red LED electrode assembly, by including the nano-scale blue LED electrode assembly, and any one or more among yellow, green, amber, and red fluorescent substances as the fluorescent substance excited by blue in the supporter, or by including the nano-scale UV LED electrode assembly, and any one or more among yellow, green, amber, and red fluorescent substances as the fluorescent substance excited by the UV in the supporter.

The first to third implementation examples of the present invention and an application example including the examples were described hereinbefore. However, the first to third implementation examples are merely implementation examples capable of being implemented by a technical spirit of the present invention, and unequal relations between the examples are not present. The present invention will be described in more detail with reference to embodiments which will be described hereinafter, but the embodiments do not limit the scope of the present invention, and should be interpreted as helping the understanding of the present invention.

Embodiment 1

The electrode line shown in FIG. 1 is manufactured on the base substrate having a thickness of 800 μm of a quartz material. In this case, in the electrode line, a width of the first installation electrode is 3 μm, a width of the second installation electrode is 3 μm, an interval between the first installation electrode and the second installation electrode which are adjacent to each other is 2.2 μm, and a thickness of the electrode is 0.2 μm, a material of the first installation electrode and the second installation electrode may be gold, and an area of a region of the electrode line in which the nano-scale LED device is installed is $4.2 \times 10^7$ μm$^2$. After this, the insulating barrier shown in FIGS. 11A through 11F is formed on the base substrate, a material of the insulating barrier is silicon dioxide, a height which is from the base substrate to an end of the insulating barrier is 0.1 μm, and the insulating barrier is formed on the base substrate by excluding the region of the electrode line in which the nano-scale LED device is installed ($4.2 \times 10^7$ μm$^2$).

After this, 0.7 parts by weight of nano-scale LED devices, with specifications listed in the following Table 1 and having a structure as shown in FIG. 5 and in which a portion of an active layer of each of the nano-scale LED devices was coated with an insulating coating film as listed in the following Table 1, was mixed with 100 parts by weight of acetone to prepare a dispersion solution including the nano-scale LED devices After this, the nano-scale LED device is self-aligned by applying the alternating current power of a sine wave having a voltage of 50 Vpp and a frequency of 950 kHz to the electrode line and dropping the solution of 9 μl eight times. After this, in order to improve contact between the nano-scale LED device and the electrode line, a thermal process is performed during two minutes at a temperature of 810° C., in a pressure of nitrogen atmosphere $5.0 \times 10^{-1}$ torr using a rapid thermal annealing (RTA), and next, an electroless deposition using gold solution of 0.05 mM and a copper metal foil may be repeatedly performed during every ten minute and two times at a room temperature. The RTA may be again performed on a gold nanoparticle attached between the electrode line and the nano-scale LED device using the electroless deposition, and the nano-scale LED electrode assembly having a specification shown in the following Table 1 may be manufactured by improving the electrical contact.

TABLE 1

|  | Material | Length (μm) | Diameter (μm) |
| --- | --- | --- | --- |
| First electrode layer | Chrome | 0.03 | 0.5 |
| First conductive semiconductor layer | n-GaN | 2.14 | 0.5 |
| Active layer | InGaN | 0.1 | 0.5 |
| Second conductive semiconductor layer | p-GaN | 0.2 | 0.5 |
| Second electrode layer | Chrome | 0.03 | 0.5 |
| Insulating film | Aluminum oxide |  | Thickness 0.02 |
| Nano-scale LED device | — | 2.5 | 0.52 |

Embodiments 2 to 4

Embodiments 2 to 4 may be manufactured like embodiment 1, but the nano-scale LED electrode assembly having a specification shown in the following Table 2 may be manufactured by changing the voltage and the frequency of the power applied to the electrode line as shown in Table 2.

Comparison Example 1

The nano-scale LED electrode assembly may be manufactured like Embodiment 1, the nano-scale LED electrode assembly having the specification shown in the following Table 2 be manufactured by changing the voltage and the frequency of the power applied to the electrode line.

Experiment Example

The following material properties regarding the nano-scale LED electrode assembly manufactured through the embodiment and the comparison example are measured.

1. Measurement of Installation Angle of Nano-Scale LED Device

The total number of LED devices emitting by inspecting an angle between the nano-scale LED devices emitting after applying the driving power to the nano-scale LED device electrode assembly and the installation electrode using an optical microscope, and the installation angle of each of the devices according to a definition of the present invention are measured, and average installation angle which is calculated as shown in Table 2. In this case, measurement results regarding Embodiments 1, 2, 4, and 5 are shown in FIGS. 17 to 20, respectively.

2. Measurement of Polarizer Degree

Results obtained by locating the polarizer (SM, DEBF-D400-DS) on an upper surface of a light emitting surface of the nano-scale LED electrode assembly, and measuring the polarized light passing through the polarizer by a charge coupled device (CCD, PSI Co. Ltd.) in the straight direction while rotating the polarizer within −90°~+90° after applying the alternating current power of a sine wave having a voltage of 60 Vpp and a frequency of 60 Hz in order to drive the nano-scale LED electrode assembly are shown in Table 2, FIG. 6C (Embodiment 1), FIG. 7C (Embodiment 2), FIG. 8C (Embodiment 4), and FIG. 13C (Embodiment 5).

As being confirmed through each drawing, it may be known that, when an angle formed by the nano-scale LED device and a polarization axis of the polarizer is close to 0°, the intensity of the emitted light is great, and when the angle is changed from 0° to ±90°, the intensity of the emitted light is small. However, according to each of the implementation examples, a polarizer degree of the light is different, and according to results obtained by calculating using Equation 1, since the polarization ratio of the nano-scale LED electrode assembly according to FIG. 6C is 0.61, the polarization ratio of the nano-scale LED electrode assembly according to FIG. 7C is 0.60, the polarization ratio of the nano-scale LED electrode assembly according to FIG. 8C is 0.45, and the polarization ratio of the nano-scale LED electrode assembly according to FIG. 13C is 0.55, it may be known that the excellent polarized light is emitted.

3. Photography of Optical Microscope of Nano-Scale LED Electrode Assembly

Photographs obtained by capturing the nano-scale LED electrode assemblies using the optical microscope are shown in FIG. 6B (Embodiment 1), FIG. 7B (Embodiment 2), FIG. 8B (Embodiment 4), and FIG. 13B (Embodiment 5).

The alignment of the nano-scale LED devices installed on the electrode through the photographs captured by the optical microscope, and the number of nano-scale LED devices per a unit electrode area may be evaluated with the naked eye.

In detail, the number of nano-scale LED devices installed per the unit electrode area may be remarkably increased as going from the nano-scale LED electrode assembly shown in FIG. 8B in which the polarization ratio of the emitted light is increased to the nano-scale LED electrode assemblies shown in FIG. 7B and FIG. 6B. Through this, a greater number of electrodes may be installed in the electrode compared with when being installed in the electrode as the alignment of the nano-scale LED devices is increased.

Meanwhile, it may be confirmed that the nano-scale LED electrode assembly according to FIG. 13B has a greater polarization ratio than the nano-scale LED electrode assembly according to FIG. 8B, but the nano-scale LED electrode assembly according to FIG. 8B has a greater number of emitted nano-scale LED devices than the nano-scale LED electrode assembly according to FIG. 13B. Accordingly, it may be confirmed that, even when the number of nano-scale LED devices installed is increased according to the condition such as the voltage, the frequency, and the waveform of the power, the polarized light is decreased or light which is not the polarized light is emitted.

4. Visual Evaluation of Light Emitting Intensity

A portion of a photograph obtained by capturing the nano-scale LED electrode assembly in a darkroom after applying the alternating current power of a sine wave having a voltage of 60 Vpp and a frequency of 60 Hz in order to drive the nano-scale LED electrode assembly is illustrated in each of FIGS. 6A (Embodiment 1), 7A (Embodiment 2), 8A (Embodiment 4), and 13A (Embodiment 5).

In detail, it may be confirmed that the nano-scale LED electrode assembly according to the implementation example of FIG. 6A is remarkably excellent in the intensity of emitted light compared with the nano-scale LED electrode assemblies according to the implementation examples of FIGS. 7A and 13A. Meanwhile, it may be known that the nano-scale LED electrode assembly of FIG. 8A is brighter than that of FIG. 13A, in a light emitting degree.

TABLE 2

| | | Embodiment 1 | Embodiment 2 | Embodiment 3 | Embodiment 4 | Embodiment 5 | Comparison Example 1 |
|---|---|---|---|---|---|---|---|
| Nano-scale LED Electrode Assembly | Power applying for self alignment | Vpp 50 V, 950 kHz | Vpp 60 V, 950 kHz | Vpp 40 V, 950 kHz | Vpp 50 V, 100 kHz | Vpp 15 V, 950 kHz | Vpp 50 V, 30 kHz |
| | The number of all of nano-scale LED devices emitting light | 8602 | 6316 | 5245 | 3970 | 1993 | 2986 |
| | Average installation angel (°) | 4.74 | 8.21 | 3.62 | 6.07 | 3.20 | 33.18 |
| | A[1](number %[2]) | 8569 (99.6) | 6231 (98.6) | 5155 (98.3) | 3830 (96.5) | 1954 (98.1) | 2215 (74.2) |
| | B[3](number %[2]) | 8200 (95.3) | 5676 (89.9) | 4595 (87.6) | 3269 (82.4) | 1736 (87.1) | 394 (13.2) |
| | C[4](number %[2]) | 7598 (88.3) | 5121 (81.1) | 4374 (83.4) | 2849 (71.8) | 1607 (80.6) | 262 (8.8) |
| | Polarizer degree | 0.61 | 0.60 | 0.55 | 0.45 | 0.55 | 0.22 |

[1]A: a device having an angle which is within a range of an average installation angle ±30° as an installation angle
[2]number % based on all of emitting nano-scale LED devices
[3]B: a device having an angle which is within a range of an average installation angle ±20° as an installation angle
[4]C: a device having an angle which is within a range of an average installation angle ±10° as an installation angle In detail, as being confirmed from Table 2, in the comparison example 1 in which the frequency of the power applied when installing the nano-scale LED devices on the installation electrode is small, the alignment of the devices is not remarkably good since a turning force of the device by an electric field is small, and thus the partially polarized light in which the polarization ratio is 0.22 is emitted.

On the contrary, in the embodiments, it may be confirmed that the partially polarized light in which the polarization ratio is 0.45 or more is emitted since the alignment of the devices is remarkably excellent.

Meanwhile, it may be confirmed that the number of nano-scale LED devices which is actually installed and emitted is different since a force capable of installing by moving the device is great as the applied voltage is increased through the comparison of embodiment 4, embodiment 5, and comparison example 1. Further, it may be confirmed that the alignment of the devices is remarkably influenced since the turning forces of the devices are different according to the frequency of the applied power.

The nano-scale LED electrode assembly according to the implementation example of the present invention may emit the partially polarized light close to the linearly polarized light as the emitted light by remarkably improving the alignment of the nano-scale LED devices installed on the nano-scale electrode line. Further, the number of nano-scale LED devices installed may be remarkably increased, and the number of LED devices installed per the unit area of the installation electrode may be increased. Moreover, the intensity of the emitted light may be further improved since the installed nano-scale LED devices are connected to the nano-scale electrode without defects such as the electrical short circuit, etc. Moreover, a remarkably excellent polarized light may be emitted without the polarizer transmitting only the polarized light in a specific direction, and thus the nano-scale LED electrode assembly according to the implementation example of the present invention may be widely used in various fields requiring the polarized light such as the polarized LED lamp, a backlight unit for display, etc.

What is claimed is:

1. A display device comprising:
   a first electrode extending in a first direction and a second electrode extending in the first direction and spaced from the first electrode;
   an insulating layer surrounding an area between the first electrode and the second electrode, at least portion of the insulating layer overlapping the first electrode and the second electrode; and
   a plurality of LED devices on the first electrode and the second electrode, the plurality of LED devices each having a long axis and extending in a direction of the long axis,
   wherein the plurality of LED devices is located at the area surrounded by the insulating layer,
   wherein an alignment angle of one or more of the LED devices is different from an alignment angle of other one or more of the LED devices, and
   wherein the alignment angle of the one or more of the LED devices is an acute angle between the direction of the long axis and a direction perpendicular to the first direction.

2. The display device of claim 1, wherein a number of the LED devices having the alignment angle that is equal to or less than 30° is equal to or greater than 80% of a total number of the LED devices.

3. The display device of claim 2, wherein a number of the LED devices having the alignment angle that is equal to or less than 10° is equal to or greater than 70% of the total number of the LED devices.

4. The display device of claim 1, wherein an average alignment angle of all of the LED devices is equal to or less than 30°.

5. The display device of claim 1, wherein the first electrode and the second electrode are electrically connected to the plurality of LED devices.

6. The display device of claim 1, wherein at least one of the LED devices comprises: a first semiconductor layer; an active layer on the first semiconductor layer; a second semiconductor layer on the active layer; and at least one insulating film covering at least an outer surface of the active layer.

7. The display device of claim 6, wherein the at least one of the LED devices further comprises at least one contact electrode layer on end of the first semiconductor layer or the second semiconductor layer, and
   wherein at least a portion of a side surface of the contact electrode layer is exposed by the first insulating film.

8. The display device of claim 1, further comprising: first electrode line extending in a second direction crossing the first direction, and
   a second electrode line extending in the second direction and spaced from the first electrode line,
   wherein the plurality of LED devices is between the first electrode line and the second electrode line.

9. The display device of claim 8, wherein the first electrode line overlaps the insulating layer and is electrically connected to the first electrode, and
   wherein the second electrode line overlaps the insulating layer and is electrically connected to the second electrode.

10. The display device of claim 1, further comprising: a third electrode spaced from the second electrode with the first electrode therebetween,
    wherein the plurality of LED devices comprises a first LED device on the first electrode and the second electrode, and a second LED device on the first electrode and the third electrode.

11. The display device of claim 1, further comprising: a third electrode between the first electrode and the second electrode, and
    a fourth electrode spaced from the third electrode with the second electrode therebetween,
    wherein the plurality of LED devices comprises a third LED device on the first electrode and the third electrode, and a fourth LED device on the second electrode and the fourth electrode.

12. The display device of claim 1, further comprising: a color control layer on the plurality of LED devices,
    wherein the color control layer comprises a color conversion particle to convert a first light from the LED devices into a second light having a different wavelength than the first light.

13. The display device of claim 12, wherein at least a portion of the color control layer is at the area surrounded by the insulating layer and overlaps the first electrode and the second electrode.

14. A display device comprising:
    a plurality of LED electrode assemblies arranged along a first direction and a second direction crossing the first direction, the plurality of LED electrode assemblies comprising a plurality of electrodes spaced from each other and extending in the first direction, and a plurality of LED devices electrically connected to the electrodes,
    an insulating layer surrounding each of the plurality of LED electrode assemblies, at least a portion of the insulating layer overlapping the electrodes, and
    a color control layer on the plurality of LED electrode assemblies and comprising a color conversion particle to convert one light from the LED devices into another light having different wavelength than the one light, wherein the LED devices are on the electrodes, are spaced from each other, have a long axis, and extend in a direction of the long axis, wherein an alignment angle of one or more of the LED devices is different from an alignment angle of other one or more of the LED devices, and wherein the alignment angle of the one or more of the LED devices is an acute angle between the direction of the long axis and a direction perpendicular to the first direction.

15. The display device of claim 14, wherein the color control layer comprises a first color control layer on a first LED electrode assembly of the plurality of LED electrode assemblies and overlapping the LED devices of the first LED electrode assembly, a second color control layer on a second LED electrode assembly of the plurality of LED electrode assemblies and overlapping the LED devices of the second LED electrode assembly, and the first color control layer is configured to convert a first light from the first LED electrode assembly into a second light having a different wavelength than the first light, and the second color control layer is configured to convert a first light from the second LED electrode assembly into a third light having a different wavelength than the first light and the second light.

16. The display device of claim 15, further comprising a light transparent layer on a third LED electrode assembly of the plurality of LED electrode assemblies and overlapping the LED devices of the third LED electrode assembly, wherein the light transparent layer is configured to transmit a first light from the third LED electrode assembly.

17. The display device of claim 14, wherein the plurality of LED electrode assemblies comprises a first LED electrode assembly comprising a first LED devices and a second LED electrode assembly comprising a second LED devices different from the first LED devices.

18. The display device of claim 17, wherein the plurality of LED electrode assemblies comprises a third LED electrode assembly comprising a third LED devices different from the first LED devices and the second LED devices.

19. The display device of claim 17, wherein the plurality of LED electrode assemblies comprises a fourth LED electrode assembly comprising first LED devices that are same as those of the first LED electrode assembly.

20. A display device comprising:

a first electrode extending in a first direction;

a second electrode extending in the first direction and spaced from the first electrode;

a third electrode comprising a first portion spaced from the first electrode and extending in the first direction, a second portion extending in the first direction between the first electrode and the second electrode, and a third portion connecting the first portion and the second portion;

a plurality of LED devices comprising a first LED device electrically contacting the first electrode and the first portion of the third electrode, and a second LED device electrically contacting the second electrode and the second portion of the third electrode; and an insulating layer surrounding an area on which the plurality of LED devices is located, at least a portion of the insulating layer overlapping the first electrode and the second electrode, wherein each of the plurality of LED devices has a long axis and extends in a direction of the long axis, wherein an alignment angle of one or more of the LED devices is different from an alignment angle of other one or more of the LED devices, wherein the alignment angle of the one or more of the LED devices is an acute angle between the direction of the long axis and a direction perpendicular to the first direction, and wherein a first end portion of the first LED device electrically contacts the first electrode, and a first end portion of the second LED device electrically contacts the second portion of the third electrode.

* * * * *